(12) United States Patent
Hino

(10) Patent No.: US 8,368,036 B2
(45) Date of Patent: Feb. 5, 2013

(54) ION IMPLANTATION METHOD AND ION IMPLANTATION APPARATUS

(75) Inventor: Masayoshi Hino, Kyoto (JP)

(73) Assignee: Nissin Ion Equipment Co., Ltd., Kyoto (JP)

(*) Notice: Subject to any disclaimer, the term of this patent is extended or adjusted under 35 U.S.C. 154(b) by 0 days.

(21) Appl. No.: 13/128,414

(22) PCT Filed: Aug. 31, 2009

(86) PCT No.: PCT/JP2009/065223
§ 371 (c)(1),
(2), (4) Date: May 10, 2011

(87) PCT Pub. No.: WO2010/055724
PCT Pub. Date: May 20, 2010

(65) Prior Publication Data
US 2011/0215263 A1 Sep. 8, 2011
US 2012/0104285 A9 May 3, 2012

(30) Foreign Application Priority Data

Nov. 12, 2008 (JP) ................................. 2008-290190

(51) Int. Cl.
*H01J 37/317* (2006.01)
(52) U.S. Cl. ................................................ 250/492.21
(58) Field of Classification Search ............... 250/492.21
See application file for complete search history.

(56) References Cited

U.S. PATENT DOCUMENTS

| 7,544,957 | B2 | 6/2009 | Walther et al. | |
| 8,017,922 | B2 * | 9/2011 | Matsumoto et al. | 250/492.21 |

FOREIGN PATENT DOCUMENTS

| JP | 11233450 | A | 8/1999 |
| JP | 2001-143651 | A | 5/2001 |
| JP | 2003086530 | A | 3/2003 |
| JP | 2005-328048 | A | 11/2005 |
| JP | 2006-196385 | A | 7/2006 |
| JP | 2006-324204 | A | 11/2006 |
| JP | 2007-173248 | A | 7/2007 |
| JP | 2008-066664 | A | 3/2008 |
| JP | 4155327 | B2 | 7/2008 |

OTHER PUBLICATIONS

International Search Report w/translation from PCT/JP2009/065223 dated Oct. 13, 2009 (4 pages).

(Continued)

*Primary Examiner* — Kiet T Nguyen
(74) *Attorney, Agent, or Firm* — Osha Liang LLP

(57) ABSTRACT

An ion implantation method and the like by which a circular implantation region and a peripheral implantation region surrounding it and the dose amount of which is different from that of the circular implantation region can be formed within the surface of the substrate without the use of the step rotation of the substrate. The ion implantation method is forms a circular implantation region and a peripheral implantation region surrounding it and a dose amount of which is different from that of the circular implantation region within a surface of the substrate by making variable a scanning speed of the ion beam 4 within the surface of the substrate and changing a scanning speed distribution, in an X direction, of the ion beam within the surface of the substrate for each one-way scanning or each reciprocative scanning, according to a position of the substrate in a Y direction.

14 Claims, 24 Drawing Sheets

OTHER PUBLICATIONS

Written Opinion from PCT/JP2009/065223 dated Oct. 13, 2009 (5 pages).
Patent Abstracts of Japan Publication No. 2005-328048 dated Nov. 24, 2005 (1 page).
Patent Abstracts of Japan Publication No. 2006-324204 dated Nov. 30, 2006 (1 page).
Patent Abstracts of Japan Publication No. 2006-196385 dated Jul. 27, 2006 (1 page).
Patent Abstracts of Japan Publication No. 2008-066664 dated Mar. 21, 2008 (1 page).
Patent Abstracts of Japan Publication No. 2007-173248 dated Jul. 5, 2007 (1 page).
Patent Abstracts of Japan Publication No. 2001-143651 dated May 25, 2001 (1 page).
Office Action for Japanese Patent Application No. 2008-290190 dated Sep. 19, 2012, with English translation thereof (7 pages).
Patent Abstract for Japanese Publication No. 2003-086530 published Mar. 20, 2003, (1 page).
Patent Abstract for Japanese Publication No. 11-233450 published Aug. 27, 1999, (1 page).

* cited by examiner

FIG. 21
FIG. 21A
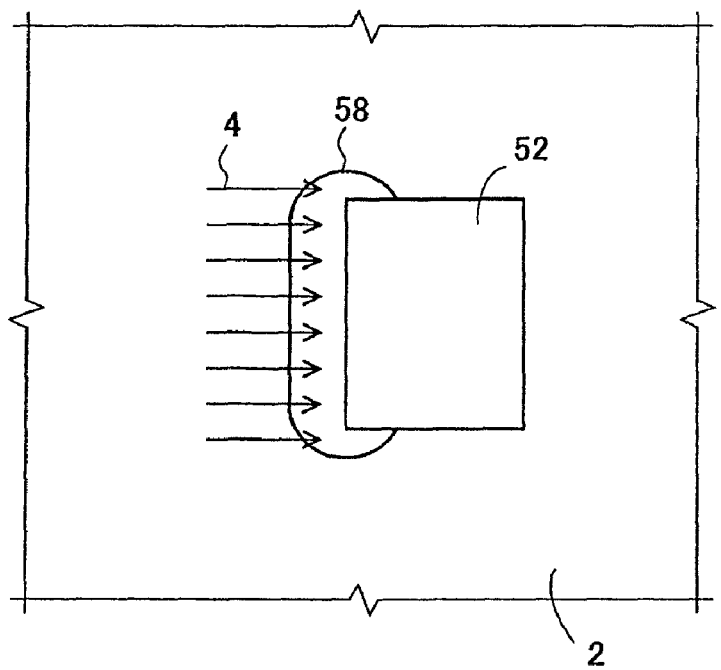
FIG. 21B
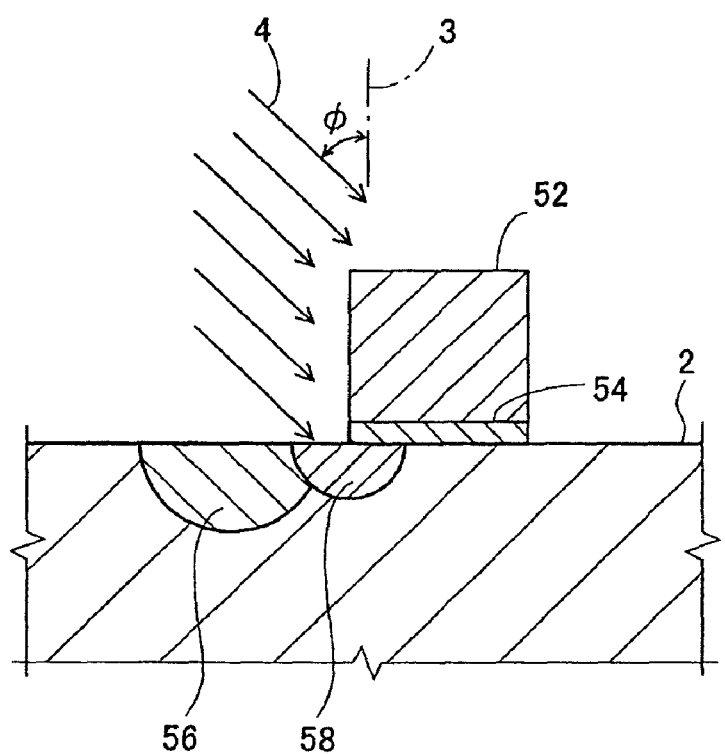

FIG. 23
FIG. 23A
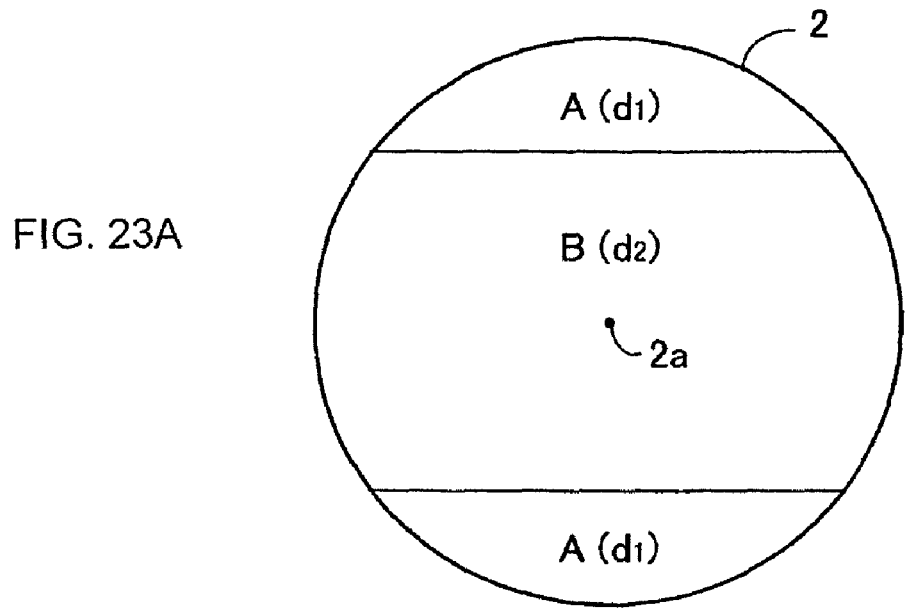
FIG. 23B
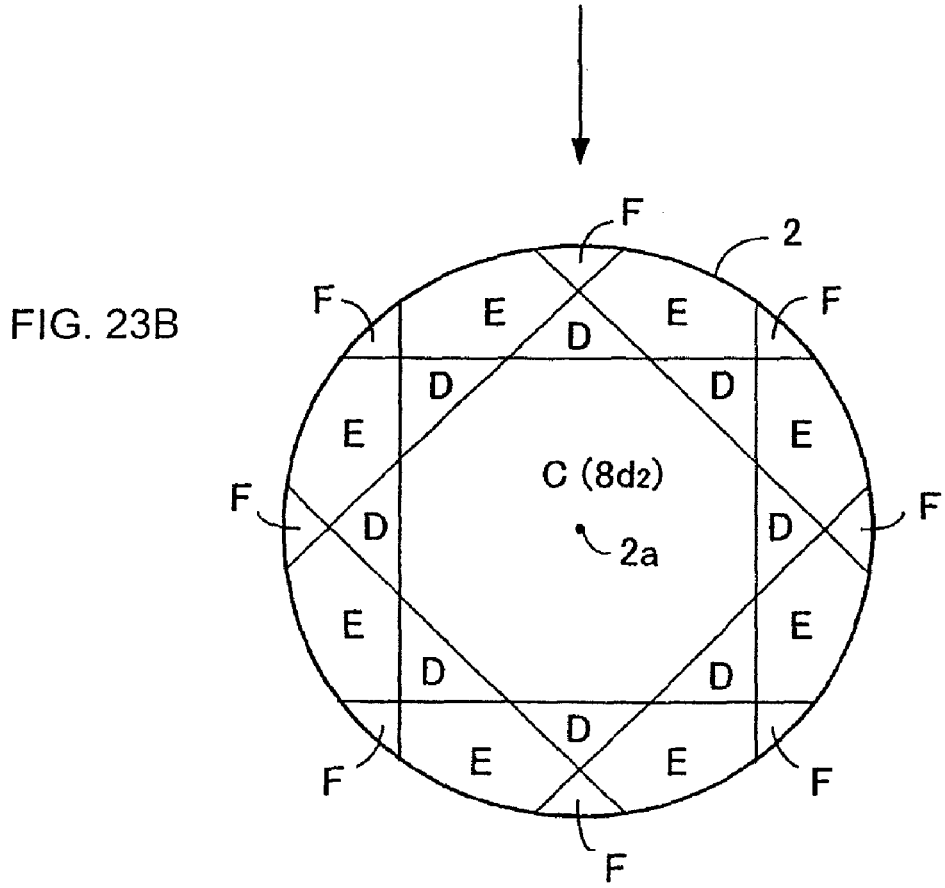

FIG. 25
FIG. 25A
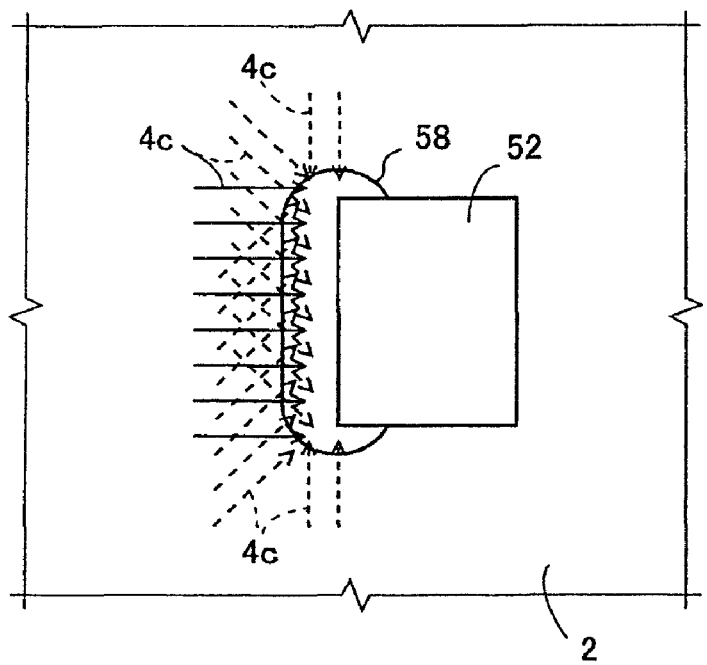
FIG. 25B
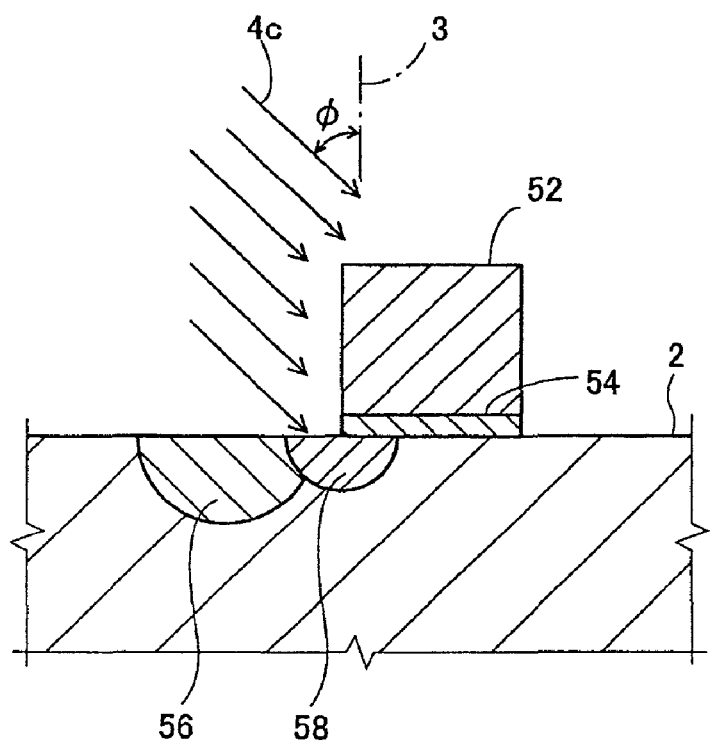

ION IMPLANTATION METHOD AND ION IMPLANTATION APPARATUS

TECHNICAL FIELD

This invention relates to an ion implantation method and apparatus in which a circular implantation region and a peripheral implantation region surrounding it and the dose amount of which is different from that of the circular implantation region are formed within the surface of a substrate (e.g. a semiconductor substrate).

BACKGROUND

In recent years, the processes of the manufacture of semiconductor devices such as Large Scale Integrations (LSIs) and memories have become complicated, and semiconductor substrates have been increased in size and have become very expensive. For this reason, it is very important to improve the yield of the semiconductor device manufacture. That is, it is very important to use one substrate as efficiently as possible. To realize this, there are cases where in the ion implantation process among a plurality of semiconductor device manufacturing processes, the distribution of the amount of dose by ion implantation is intentionally made nonuniform within the surface of the substrate. As described above, there is a strong demand for the correction of the semiconductor device property in a specific region in a semiconductor device formed within the surface of the substrate.

For example, in the manufacture of a semiconductor device, in the process preceding ion implantation (e.g. a thin film formation process by vacuum deposition or Chemical Vapor Deposition (CVD), or an etching process), to uniformly perform processing within the surface of the substrate, in many cases, processing is performed with the substrate being rotated. However, even by that, processing cannot completely uniformly be performed, and as to property variation of the semiconductor device formed within the surface of the substrate, there is a tendency for variation to occur between a circular region and a peripheral region surrounding it.

To cite a more concrete example, the thickness of a gate oxide film formed on the substrate in the process preceding ion implantation tends to vary between a circular region and a peripheral region surrounding it within the surface of the substrate. If this is left as it is, in the manufacturing process in which a multiplicity of field-effect transistors are formed on a semiconductor substrate, variation occurs in the property of the field-effect transistors and the yield decreases.

Therefore, it is important to make it possible to form a circular implantation region and a peripheral implantation region surrounding it and the dose amount of which is different from that of the circular implantation region within the surface of the substrate in the ion implantation process. By thus changing the dose amount distribution, it is made possible to correct the variation in semiconductor device (e.g. field-effect transistor) property between the circular region and the peripheral region within the surface of the substrate and improve yield.

As a method capable of performing the ion implantation as described above, a method has been proposed in which as shown in FIG. 22, ion implantation is performed into a substrate 2 both by reciprocatively scanning an ion beam 4c in an X direction by an electric field or a magnetic field and by mechanically driving the substrate 2 in a Y direction intersecting the X direction. That is, this is an ion implantation method in which under a condition where the ion beam 4c is incident on the substrate 2, a circular implantation region and a peripheral implantation region surrounding it and the dose amount of which is different from that of the circular implantation region are formed within the surface of the substrate 2 both by stepwisely changing the scanning speed of the ion beam 4c or the driving speed of the substrate 2 and by step-rotating the substrate 2 about the central portion 2a thereof by 360/n degrees (n is the number of times of the implantation process), for example, in a direction indicated by the arrow J (see, for example, Japanese Patent Publication No. 4155327). The ion implantation using the step rotation of the substrate 2 as described above will be called step rotation implantation.

According to the above-described conventional ion implantation method, for example, it is possible to form three implantation regions A, B and A as shown in A of FIG. 23 after the first implantation process and form a plurality of implantation regions C to F as shown in B of FIG. 23 after the eighth (when n=8) implantation process. The central implantation region C is the circular implantation region, and the implantation regions D to F surrounding it are the peripheral implantation regions.

When the dose amount of one implantation process is $d_1$ and $d_2$, the dose amounts of the above-mentioned implantation regions A to F are mathematically as follows:

Implantation region A: dose amount $d_1$
Implantation region B: dose amount $d_2$
Implantation region C: dose amount $8d_2$
Implantation region D: dose amount $2d_1+6d_2$
Implantation region E: dose amount $4d_1+4d_2$
Implantation region F: dose amount $6d_1+2d_2$ Patent Document Patent Document 1: Japanese Patent Publication No. 4155327 (paragraphs 0009 to 0014, FIG. 2, FIG. 12)

SUMMARY OF THE INVENTION

The above-described conventional ion implantation method where the step rotation of the substrate must be used to form the circular implantation region has a problem in that it cannot be applied to an implantation process in which step rotation implantation must not be performed.

For example, when ion implantation is performed while a tile angle (This is also called an implantation angle. The same applies thereinafter.) φ which is an angle formed between a normal 3 to the surface of the substrate 2 and the ion beam 4c is larger than zero degrees as in the example shown in FIG. 24, there are cases where step rotation implantation must not be performed.

This is because if ion implantation is performed by using the step rotation of the substrate 2 in the case of the tile angle φ as described above, when focus is placed on a certain region on the substrate 2, the direction of the ion beam 4c incident on the region changes every step rotation of the substrate 2. If the incident direction of the ion beam 4c changes, the implantation property changes and a problem occurs such that desired implantation processing cannot be performed on the substrate 2.

To cite a more concrete example, for example as in the example shown in FIG. 25, in a manufacturing process in which a field-effect transistor (Although only one transistor is shown in FIG. 25, in ordinary cases, a plurality of transistors are formed. This also applies to FIG. 21.) including a gate electrode 52, a gate oxide film 54, a source (or drain) 56 and an extension 58 (This is an electrical connection portion between the source or the drain, and the channel.) is formed on a semiconductor substrate 2, a dopant is implanted into the part of the extension 58 by the irradiation of the ion beam 4. In this case, since it is necessary to also implant the dopant to a lower part of the gate oxide film 54, ion implantation is performed with a comparatively large tilt angle φ.

If ion implantation is performed by using the step rotation of the substrate 2 as described above with the tile angle φ as mentioned above, as shown in A of FIG. 25, the direction of the ion beam 4c incident on the extension 58 changes every step rotation of the substrate 2. Consequently, for example, the relative angle between the crystal lattice of the silicon in the extension 58, and the ion beam 4 changes every step rotation of the substrate 2. For this reason, the depth of the dopant implanted into the extension 58, the condition of the surface defect of the part of the extension 58, and the like change every step rotation of the substrate 2, so that the desired device property cannot be obtained.

Moreover, according to the above-described conventional ion implantation method, since step rotation implantation is used, as is understood from B of FIG. 23 and the above description thereof, only a dose amount distribution rotationally symmetric with respect to the central portion 2a of the substrate 2 can be formed. Further, when viewed strictly, the dose amounts of the implantation regions D to F in the peripheral part are slightly different from one another.

Accordingly, a principal object of this invention is to provide an ion implantation method and apparatus by which a circular implantation region and a peripheral implantation region surrounding it and the dose amount of which is different from that of the circular implantation region can be formed within the surface of the substrate without the use of the step rotation of the substrate.

An ion implantation method according to one or more embodiment of the invention for performing ion implantation into a substrate both by reciprocatively scanning an ion beam in a first direction and by mechanically driving the substrate in a second direction intersecting the first direction while making a driving speed of the substrate directly proportional to a beam current density of the ion beam in a region where the ion beam is incident on the substrate includes a circular implantation region and a peripheral implantation region surrounding it and a dose amount of which is different from that of the circular implantation region are formed within a surface of the substrate by making variable a scanning speed of the ion beam within the surface of the substrate and changing a scanning speed distribution, in the first direction, of the ion beam within the surface of the substrate for each one-way scanning or each reciprocative scanning, according to a position of the substrate in the second direction, without a rotation of the substrate. Further, the scanning speed distribution includes a scanning speed distribution in which the scanning speed of the ion beam changes partially.

An ion implantation apparatus according to one or more embodiments of the invention performs ion implantation into a substrate both by reciprocatively scanning an ion beam in a first direction and by mechanically driving the substrate in a second direction intersecting the first direction while making a driving speed of the substrate directly proportional to a beam current density of the ion beam in a region where the ion beam is incident on the substrate. One or more embodiments of the apparatus includes a beam scanner that reciprocatively scans the ion beam in the first direction by an electric field or a magnetic field, a scanning speed of the ion beam within a surface of the substrate being variable and a substrate driver that mechanically drives the substrate in the second direction. The apparatus may also include a substrate position detector that detects a position of the substrate in the second direction and outputs position information representing the position and a controller that performs control to form a circular implantation region and a peripheral implantation region surrounding it and a dose amount of which is different from that of the circular implantation region within a surface of the substrate by controlling the beam scanner based on the position information from the substrate position detector to thereby change a scanning speed distribution, in the first direction, of the ion beam within the surface of the substrate for each one-way scanning or each reciprocative scanning, according to the position of the substrate in the second direction, without a rotation of the substrate. Further, the scanning speed distribution includes a scanning speed distribution in which the scanning speed of the ion beam changes partially.

The dose amount distribution of the circular implantation region may be made a gradually swelling dose amount distribution, a gradually recessed dose amount distribution, a uniformly swelling dose amount distribution or a uniformly recessed dose amount distribution.

The ion implantation may be performed while a tilt angle which is an angle formed between a normal to the surface of the substrate and the ion beam is larger than zero degrees.

According to one or more embodiments of the invention, a circular implantation region and a peripheral implantation region surrounding it and the dose amount of which is different from that of the circular implantation region are formed within the surface of the substrate by changing the scanning speed distribution, in the first direction, of the ion beam within the surface of the substrate for each one-way scanning or one reciprocative scanning according to the position of the substrate in the second direction. Consequently, the circular implantation region and the peripheral implantation region the dose amounts of which are different from each other can be formed within the surface of the substrate without the use of the step rotation of the substrate.

As a result, one or more embodiments of the invention are also applicable to an implantation process where step rotation implantation must not be performed. For example, the correction of the semiconductor device property in a specific region in a semiconductor device formed within the surface of the substrate can be performed without the use of the step rotation of the substrate.

Moreover, the circular implantation region and the peripheral implantation region the dose amounts of which are different from each other can be formed within the surface of the substrate without the use of the step rotation of the substrate. Consequently, unlike in the case where the step rotation of the substrate is used, a dose amount distribution other than a rotationally symmetric distribution can be formed, so that a dose amount distribution with a high degree of freedom can be formed. Further, the uniformity of the dose amount distribution of the peripheral implantation region can be improved. Furthermore, the driving speed of the substrate is made to be directly proportional to a beam current density of the ion beam in a region where the ion beam is incident on the substrate, and thus, even if the beam current density of the ion beam changes during the ion implantation into the substrate, by compensating for this change with the driving speed, the dose amount for the substrate can be prevented from changing. That is, ion implantation can be performed into the substrate with a stable dose amount.

According to one or more embodiments of the invention, the following further effect is produced: The circular implantation region and the peripheral implantation region can be formed by ion implantation with a tilt angle larger than zero degrees. Further, even in that case, unlike in the case where the step rotation of the substrate is used, since the direction of the ion beam incident on the substrate is invariant, a trouble such that the implantation property is changed by a change of the incident direction of the ion beam can be prevented from occurring.

BRIEF DESCRIPTION OF THE DRAWINGS

FIG. 21 is a schematic view showing an example of a case where in the manufacturing process of forming a field-effect transistor on the substrate, ion implantation is performed with respect to the extension of the field-effect transistor using the ion implantation method in accordance with one or more embodiments of the invention so as to be enlarged, FIG. 21A is a plan view and FIG. 21B is a sectional view.

FIG. 23 is a schematic view showing an example of the dose amount distribution formed by the conventional ion implantation method, FIG. 23A is after the first implantation process and FIG. 23B is after the eighth implantation process.

FIG. 25 is a schematic view showing an example of a case where in the manufacturing process of forming a field-effect transistor on the substrate, ion implantation is performed with respect to the extension of the field-effect transistor using the conventional ion implantation method so as to be enlarged, FIG. 25A is a plan view and FIG. 25B is a sectional view.

DETAILED DESCRIPTION

Figure 1:
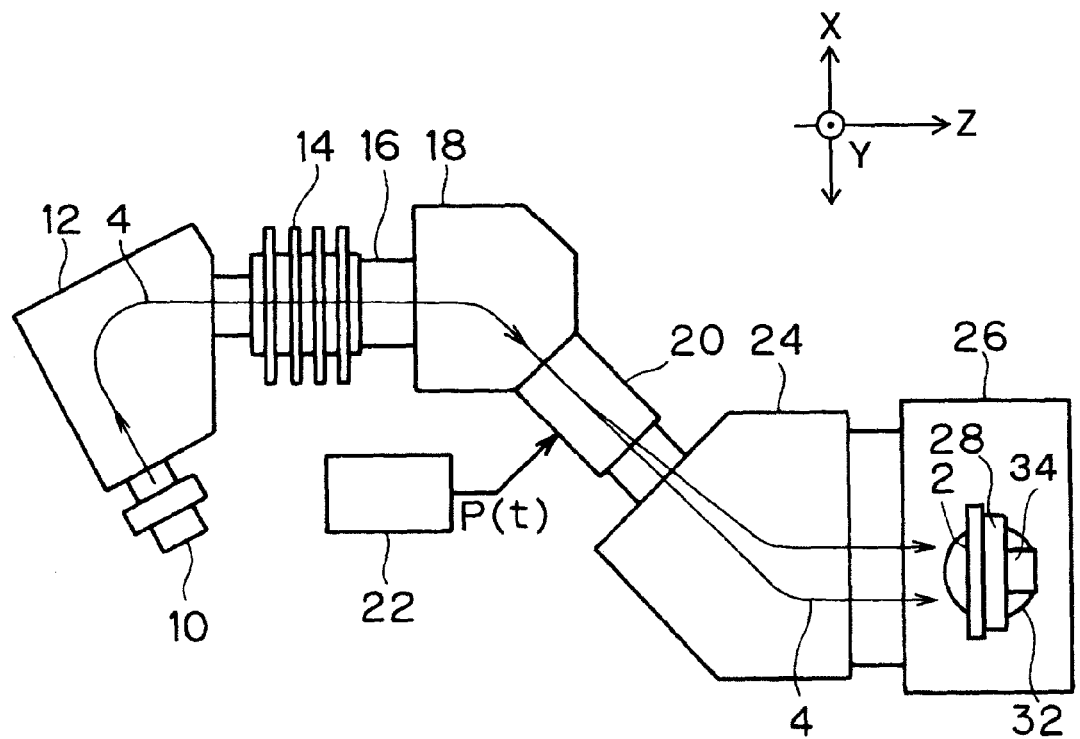
FIG. 1 is a schematic plan view showing an embodiment of the ion implantation apparatus carrying out the ion implantation method according to one or more embodiments of the claimed invention.
Figure 2:
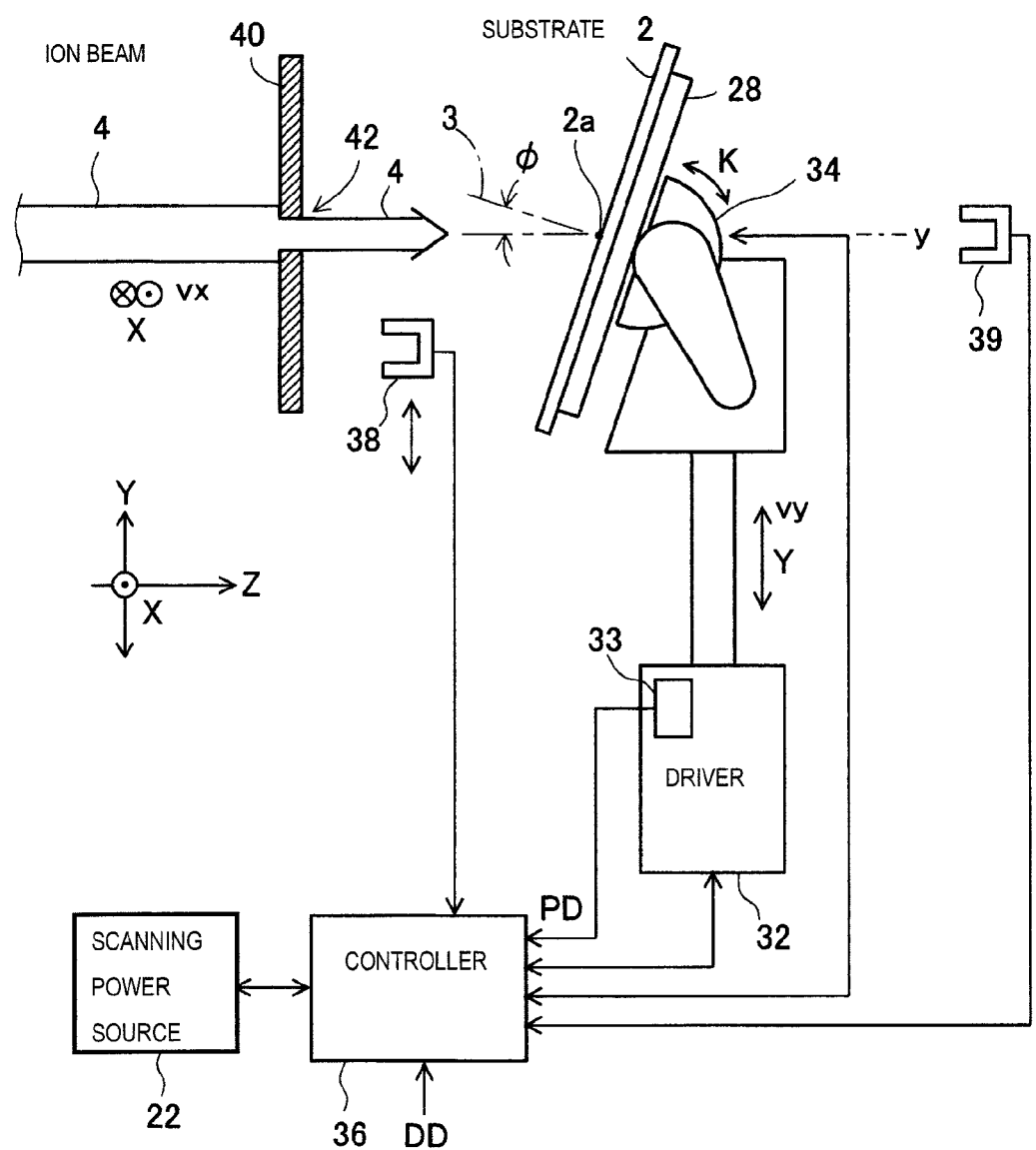
FIG. 2 is a schematic side view showing an example of a neighborhood of the substrate of the ion implantation apparatus of FIG. 1 so as to be enlarged in accordance with one or more embodiments of the invention.

FIG. 1 is a schematic plan view showing an embodiment of the ion implantation apparatus carrying out the ion implantation method according to one or more embodiments of the invention. FIG. 2 is a schematic side view showing an example of a neighborhood of the substrate of the ion implantation apparatus of FIG. 1 so as to be enlarged.

It is assumed that the direction of travel of the ion beam 4 is always a Z direction and two directions substantially orthogonal to each other within a plane substantially orthogonal to this Z direction are an X direction and a Y direction. In the embodiment described below, as an example, the first direction in which the ion beam 4 is reciprocatively scanned is the X direction, and the second direction in which the substrate 2 is driven is the Y direction. The X direction and the Z direction are, for example, horizontal directions, and the Y direction is, for example, a vertical direction. However, the present invention is not limited thereto; for example, a direction substantially parallel to the surface of the substrate 2 may be the second direction in which the substrate 2 is driven.

This ion implantation apparatus is what is called a hybrid scan type, and has a structure that performs ion implantation into the entire surface of the substrate 2 both by reciprocatively scanning the ion beam 4 in the X direction by an electric field or a magnetic field and by mechanically driving the substrate (e.g. semiconductor substrate) 2 in the Y direction intersecting the X direction.

This ion implantation apparatus is, more specifically, provided with: an ion source 10 from which the ion beam 4 is derived; a mass separation magnet 12 that sorts out and derives a specific ion species from the ion beam 4 derived from the ion source 10; an acceleration and deceleration tube 14 that accelerates or decelerates the ion beam 4 derived from the mass separation magnet 12; a Q-lens 16 that shapes the ion beam 4 derived from the acceleration and deceleration tube 14; an energy separator 18 that sorts out and derives an ion of specific energy from the ion beam 4 derived from the Q-lens 16; a scanner 20 that reciprocatively scans the ion beam 4 derived from the energy separator 18 in the X direction by an electric field or a magnetic field; and a beam parallelizer 24 that creates the ion beam 4 parallelly scanned in the X direction, by parallelly scanning the ion beam 4 in cooperation with the scanner 20 by bending the ion beam 4 derived from the scanner 20 by an electric field or a magnetic field.

The ion beam 4 derived from the beam parallelizer 24 is applied to the substrate 2 held by a holder 28 in an implantation chamber 26, thereby performing ion implantation into the substrate 2. In that case, the substrate 2 is driven in the Y direction by a substrate driver 32. Although this driving is normally reciprocative driving, there are cases where it ends with a reciprocative driving and one one-way driving depending on the necessary dose amount and the like. By the cooperation of the driving of the substrate 2 and the reciprocative scanning of the ion beam 4, ion implantation can be performed into the entire surface of the substrate 2.

The substrate driver 32 has, in this embodiment, a substrate position detector 33 that detects the position, in the second direction, of the substrate 2 on the holder 28, that is, a position y (This may be, for example, the central portion 2a of the substrate 2 as in the example shown in FIG. 2, etc., or may be another position.) in the Y direction in this embodiment and outputs position information PD representing the position.

While the substrate position detector 33 is, for example, an encoder or a potentiometer that responds to the above-described driving of the substrate 2 by the substrate driver 32, it may be other than that. Moreover, this substrate position detector 33 may be provided separately from the substrate driver 32.

It is desirable that the driving speed vy of the substrate 2 in the Y direction be controlled so as to be directly proportional to the beam current density of the ion beam 4 in the region where the ion beam 4 is incident on the substrate 2 as also described in the above-mentioned Patent Document 1. By doing so, even if the beam current density of the ion beam 4 changes during the ion implantation into the substrate 2, by compensating for this change with the driving speed vy, the dose amount for the substrate 2 can be prevented from changing. That is, ion implantation can be performed into the substrate 2 with a stable dose amount.

This ion implantation apparatus is further provided with, as shown in FIG. 2, a tilt angle changer 34 that changes the tilt angle φ which is an angle formed between the normal 3 to the surface of the substrate 2 and the ion beam 4, for example, by rotating the substrate 2 and the holder 28 about the central portion 2a of the surface of the substrate 2 on the holder 28 as shown by the arrow K to thereby change the inclinations of the members 2 and 28. By this, ion implantation can be performed with the tilt angle φ being zero degrees or larger than zero degrees. The tilt angle changer 34 is, for example, a motor. The substrate driver 32 drives this tilt angle changer 34 and the entire holder 28 and substrate 2 in the Y direction.

The scanning of the ion beam 4 in the X direction is controlled by a scanning output P(t) supplied from a scanning power source 22 to the scanner 20. (t) represents being a function of time t. The scanning output P(t) is, for example, a scanning voltage when the scanner 20 scans the ion beam 4 by an electric field, and a scanning current when the scanner 20 scans by a magnetic field. The scanning power source 22 and the scanner 20, or the members 20 and 22 and the beam parallelizer 24 constitute a beam scanner that reciprocatively scans the ion beam 4 in the X direction. This beam scanner, more specifically the scanning power source 22 thereof is capable of changing the scanning speed vx of the ion beam 4 within the surface of the substrate 2 as described later by being controlled by a controller 36 described later.

A slit-form opening 42 elongated in the X direction is provided upstream of the holder 28, and a mask 40 that shapes the ion beam is provided as required.

A front multipoint faraday 38 and a back multipoint faraday 39 that receive the ion beam 4, measure its beam current density distribution in the X direction and are used for the waveform adjustment of the scanning output P(t) and the like are provided upstream and downstream of the holder 28. These multipoint faradays 38 and 39 include a plurality of Faraday cups aligned in the X direction. The back multipoint faraday 39 is fixed onto the beam line of the ion beam 4. The front multipoint faraday 38 and the holder 28 are, for example, driven in the Y direction and placed on the beam line of the ion beam 4 only when necessary. Multipoint faradays similar to these are also described, for example, in Japanese Unexamined Patent Application Publication No. 2001-143651.

The measurement information by the multipoint faradays 38 and 39 and the position information PD from the substrate position detector 33 are supplied to the controller 36. In this embodiment, further, dose amount distribution setting information DD to set a desired dose amount distribution formed within the surface of the substrate 2, more specifically a desired dose amount distribution including the dose amount distribution of a circular implantation region 44 and a peripheral implantation region 46 described later, and the like are supplied to the controller 36. The controller 36 has functions such as (a) a function of controlling the scanning direction vx of the ion beam 4 in the X direction within the surface of the substrate 2 as described later by controlling the above-described beam scanner (specifically, in this embodiment, by controlling the scanning power source 22 as described above. The same applies hereinafter.); (b) a function of performing setting to a predetermined tilt angle φ by controlling the tilt angle changer 34; and (c) a function of controlling the driving of the substrate 2, etc. in the Y direction by the substrate driver 32 by controlling the substrate driver 32, and performing control so that the driving speed vy, in the Y direction, of the substrate 2 on the holder 28 is directly proportional to the beam current density of the ion beam 4 as described above based on these pieces of information.

Some examples of the ion implantation method will be described in which in the ion implantation apparatus as described above, a circular implantation region and a peripheral implantation region surrounding it and the dose amount of which is different from that of the circular implantation region are formed within the surface of the substrate 2.

Figure 3:
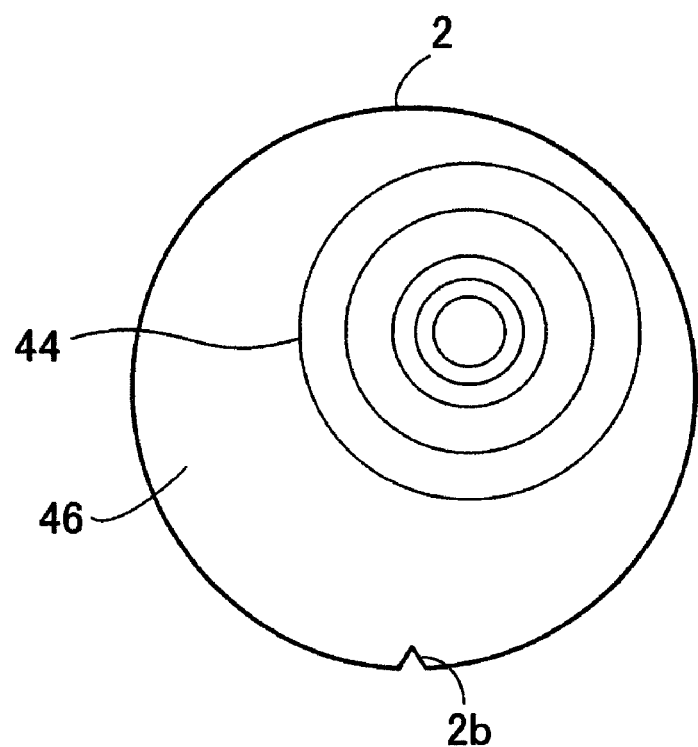
FIG. 3 is a schematic view showing an example of the dose amount distribution formed within the surface of the substrate in accordance with one or more embodiments of the invention.
Figure 4:
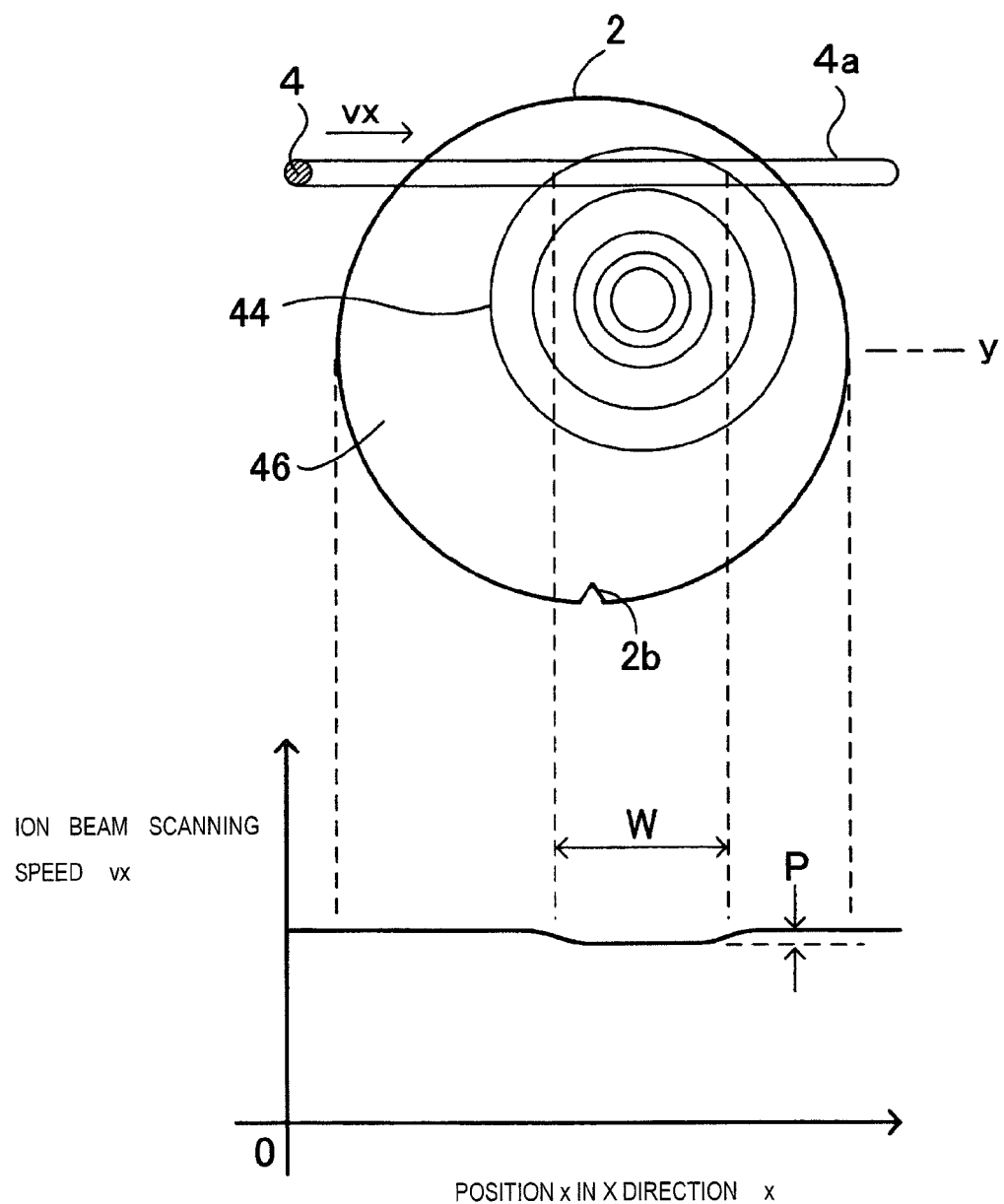
FIG. 4 is a view showing an example of the scanning speed distribution of one-way scanning of the ion beam when the dose amount distribution shown in FIG. 3 is formed in accordance with one or more embodiments of the invention, and is followed by FIG. 5.
Figure 5:
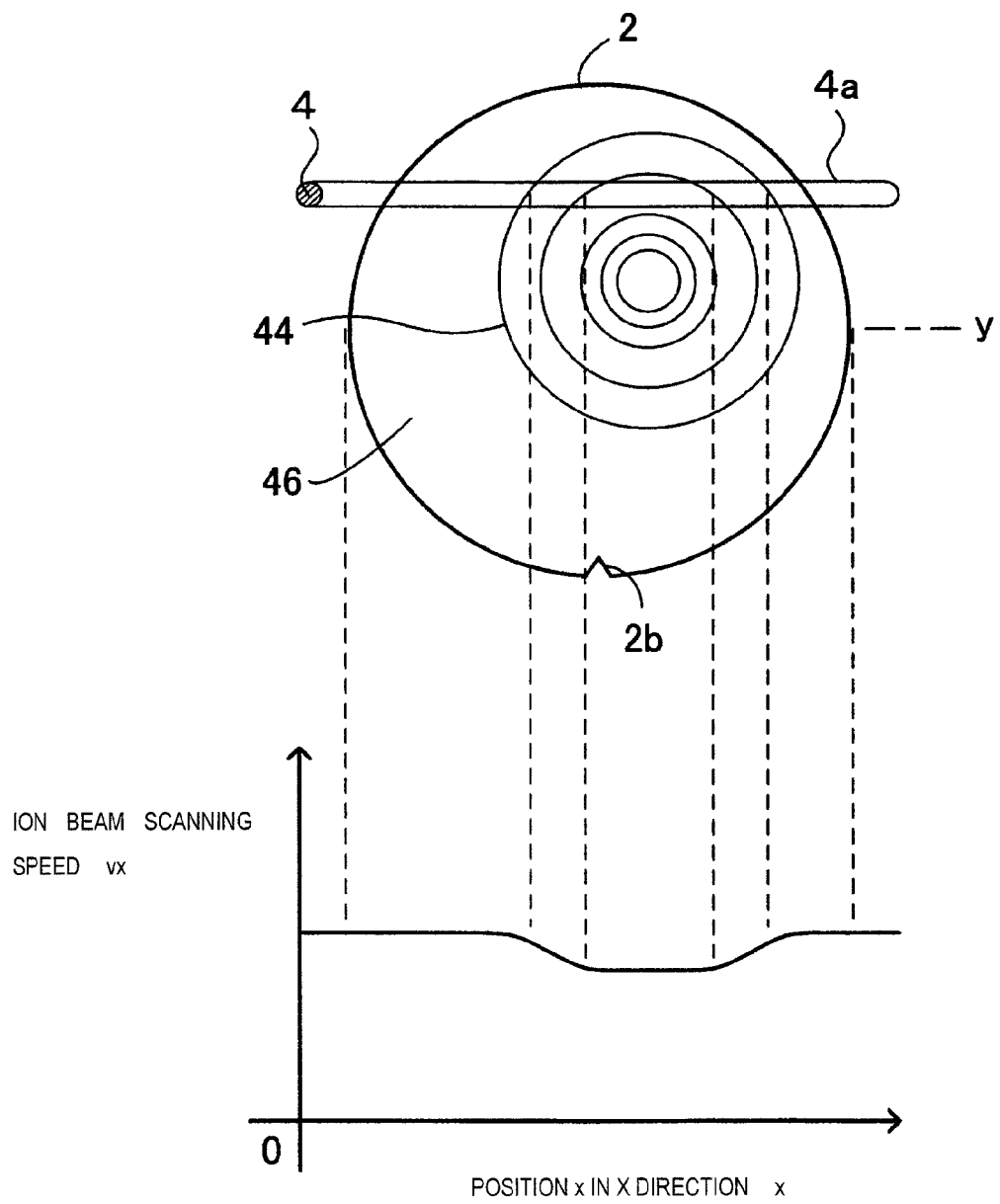
FIG. 5 is a view showing an example of the scanning speed distribution of one-way scanning of the ion beam when the dose amount distribution shown in FIG. 3 is formed in accordance with one or more embodiments of the invention, and is followed by FIG. 6.
Figure 6:
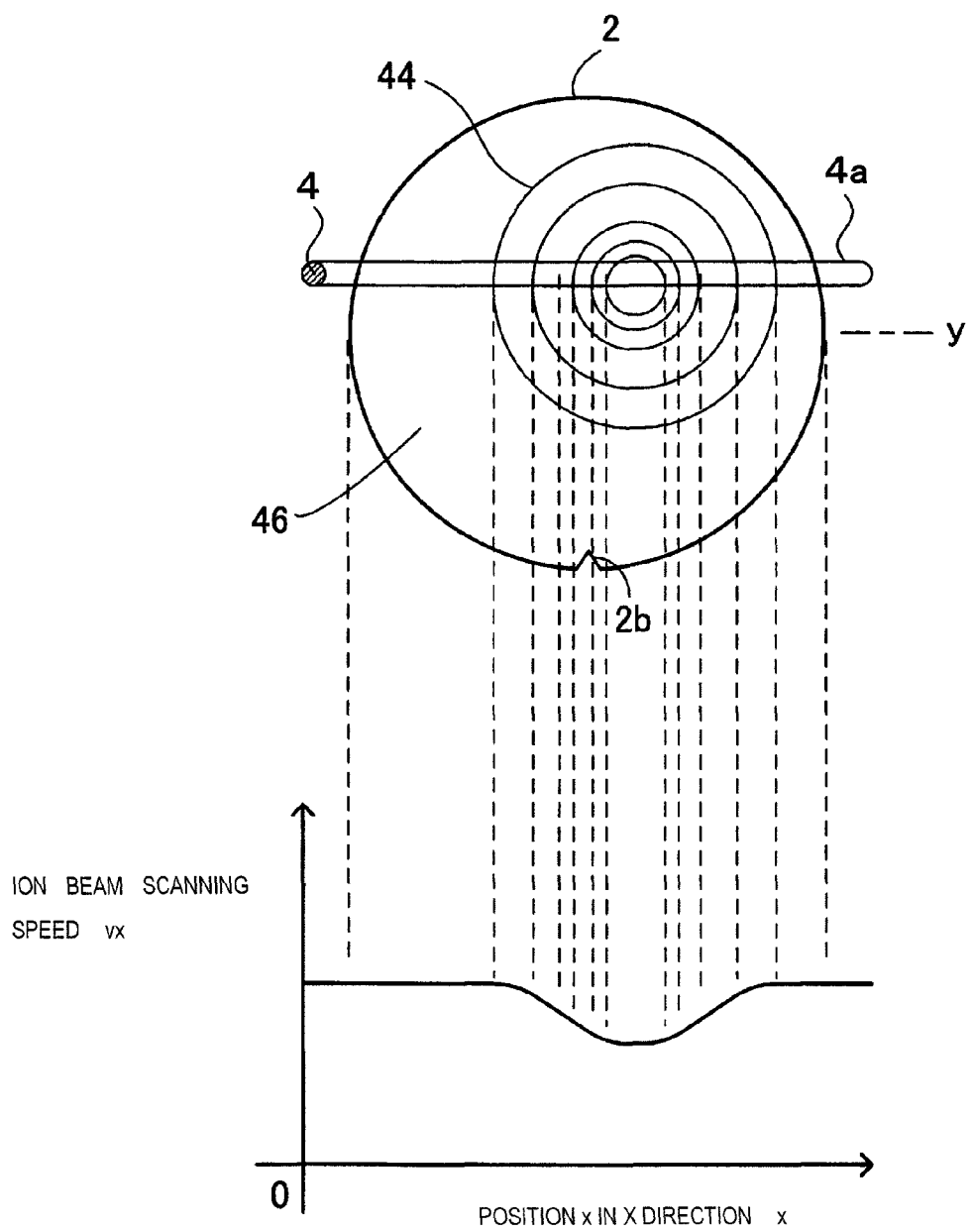
FIG. 6 is a view showing an example of the scanning speed distribution of one-way scanning of the ion beam when the dose amount distribution shown in FIG. 3 is formed in accordance with one or more embodiments of the invention, and is followed by FIG. 7.
Figure 7:
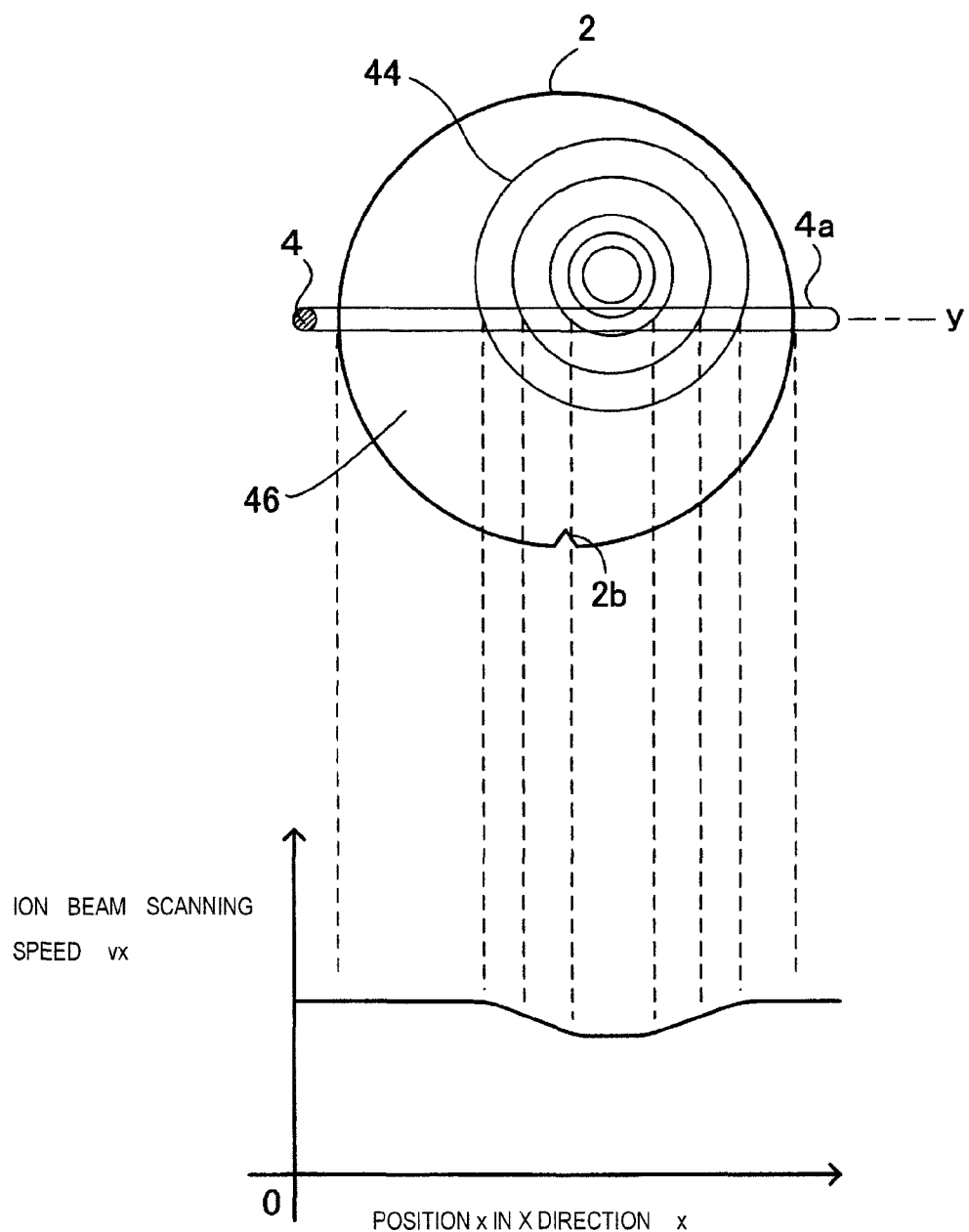
FIG. 7 is a view showing an example of the scanning speed distribution of one-way scanning of the ion beam when the dose amount distribution shown in FIG. 3 is formed in accordance with one or more embodiments of the invention, and is followed by FIG. 8.
Figure 8:
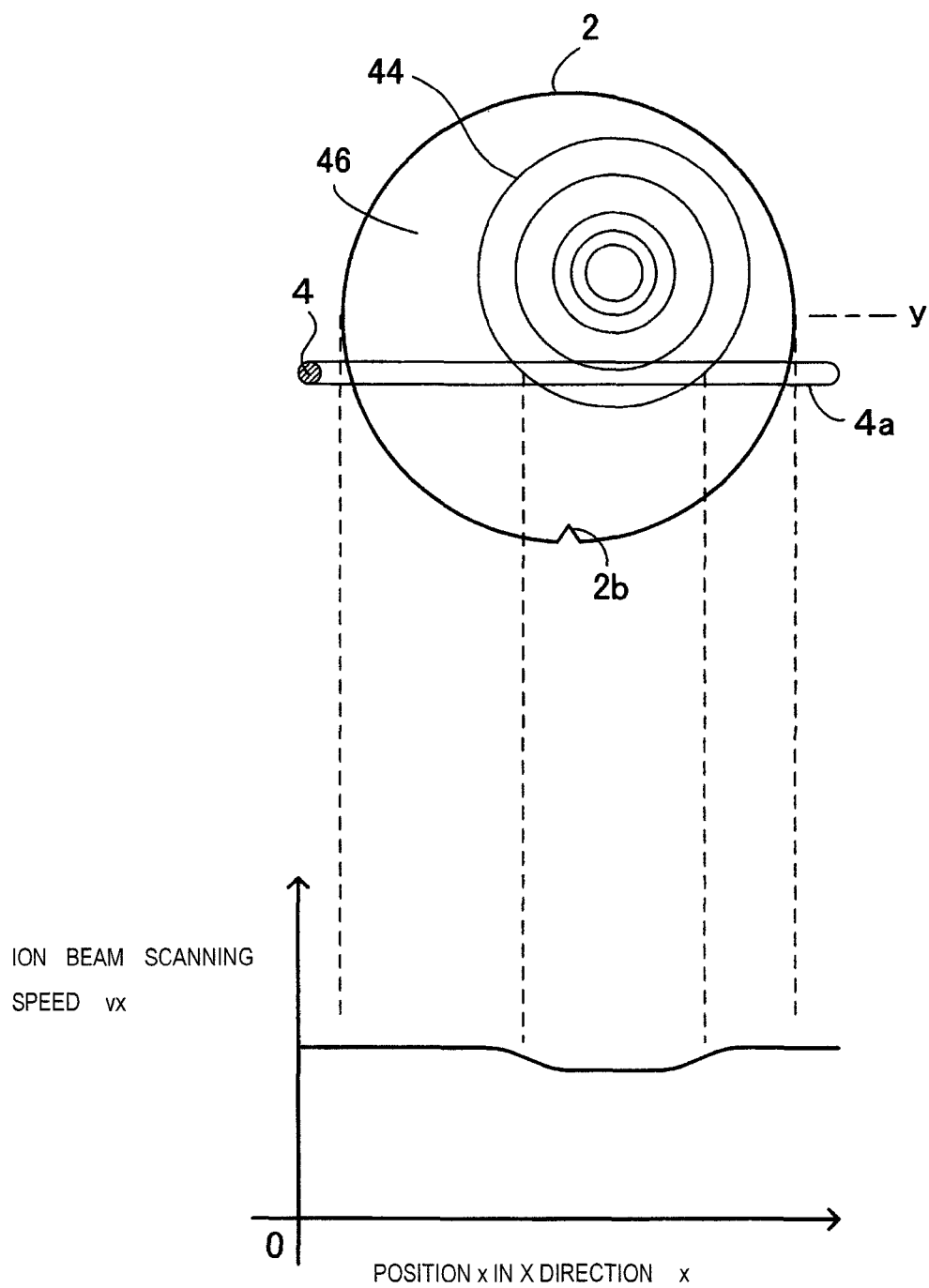
FIG. 8 is a view showing an example of the scanning speed distribution of one-way scanning of the ion beam when the dose amount distribution shown in FIG. 3 is formed in accordance with one or more embodiments of the invention, and is followed by FIG. 9.

FIG. 3 shows an example of the dose amount distribution formed within the surface of the substrate 2 in accordance with one or more embodiments of the invention. The circular implantation region 44 and the peripheral implantation region 46 surrounding it and the dose amount of which is different from that of the circular implantation region 44 are formed within the surface of the substrate 2. The circular implantation region 44 has, in this example, a dose amount distribution gradually swelling like a mountain. More specifically, it has a dose amount distribution swelling in the form of a plurality of concentric circles. The peripheral implantation region 46 has, in this example, a flat dose amount distribution. Such dose amount distributions are supplied to the controller 36, for example, as the above-mentioned dose amount distribution setting information DD (The same applied to the case of other dose amount distributions shown in FIG. 11, etc.).

While in the drawings referred to below, a notch (notch) 2b of the substrate 2 is shown to indicate that the substrate 2 is not rotated, the position of the notch 2b is not limited to the position of the illustrated example.

Figure 9:
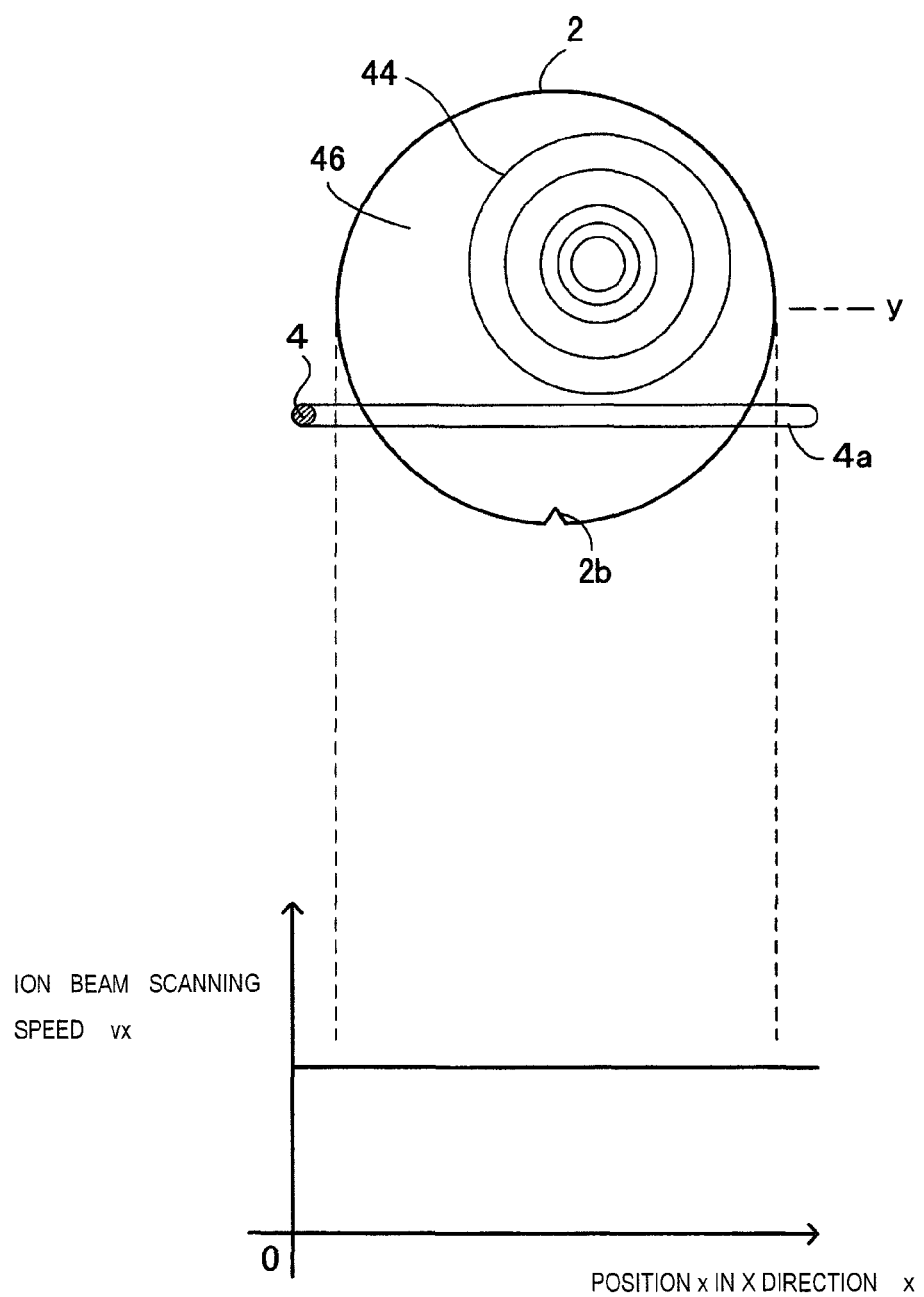
FIG. 9 is a view showing an example of the scanning speed distribution of one-way scanning of the ion beam when the dose amount distribution shown in FIG. 3 is formed in accordance with one or more embodiments of the invention, and is followed by FIG. 10.
Figure 10:
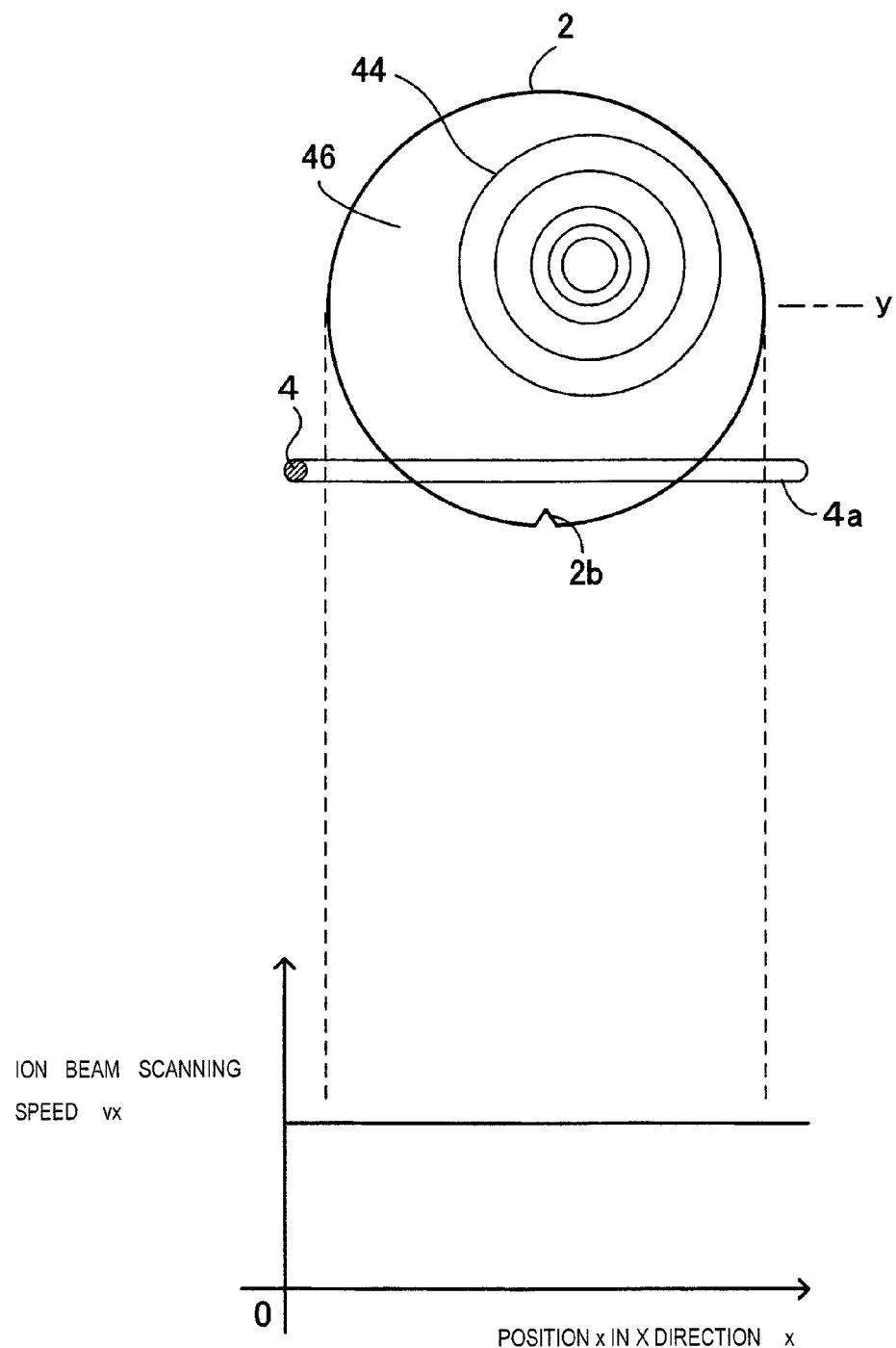
FIG. 10 is a view showing an example of the scanning speed distribution of one-way scanning of the ion beam when the dose amount distribution shown in FIG. 3 is formed in accordance with one or more embodiments of the invention.

In accordance with one or more embodiments of the invention, an example of the distribution of the scanning speed vx (that is, the scanning speed distribution), in the X direction, of one-way scanning of the ion beam 4 when the dose amount distribution shown in FIG. 3 is formed is shown in FIGS. 4 to 10. These figures show the substrate 2 viewed from the front in order that the dose amount distribution formation operation is easy to understand. These figures are a series of figures, the position of the ion beam 4 in the Y direction is invariant, and the substrate 2 is driven in the Y direction so that the position y thereof becomes higher as the figure number ascends. The processes before FIG. 4 and after FIG. 10 are not shown since the scanning speed distribution of the ion beam 4 is flat. These also apply to FIGS. 12 to 18 described later.

The ion beam 4 as the origin of scanning has a predetermined cross-sectional shape (Although this cross-sectional shape is a circle in FIG. 4, etc. for simplification of illustration, it is not limited to a circle.) and a predetermined cross-sectional size, and this is scanned in the X direction at the scanning speed vx as described above. The locus of one one-way scanning thereof is shown by reference numeral 4a (This applies to FIGS. 12 to 18.).

The scanning speed vx of the ion beam 4 within the surface of the substrate 2 is variable as mentioned above, and by sequentially (successively) changing the scanning speed distribution of this ion beam 4 within the surface of the substrate 2 according to the position y of the substrate 2 in the Y direction as in the example shown in FIGS. 4 to 10, the circular implantation region 44 and the peripheral implantation region 46 are formed within the surface of the substrate 2. That is, not only the scanning speed vx of the ion beam 4 is changed according to the position x in the X direction but also the scanning speed distribution of the ion beam 4 in the X direction which distribution includes such a change is successively changed according to the position y of the substrate 2 in the Y direction.

More specifically, as in the example shown in FIGS. 4 to 8, the scanning speed distribution of the ion beam 4 when the circular implantation region 44 is formed is made concave, and the width W and the depth P of the concave portion are changed according to the position y of the substrate 2 in the Y direction. By this, the above-described circular implantation region 44 can be formed. This is because the dose amount for the substrate 2 is inversely proportional to the scanning speed vx of the ion beam 4 when the beam current density of the ion beam 4 is constant. That is, this is because the scanning speed vx of the ion beam 4 and the dose amount are in an opposite relationship with each other, the dose amount is small in a region where the scanning speed vx is high and the dose amount is large in a region where the scanning speed vx is low.

How the position, width W and depth P of the concave portion of the scanning speed distribution of the ion beam 4 are to be set is determined according to the position and size of the circular implantation region 44 to be formed and the dose amount distribution thereof.

After the passage of the ion beam 4 through the circular implantation region 44 ceases, the scanning speed distribution of the ion beam 4 is made, for example, flat (see FIGS. 9 and 10).

More specifically, each dose amount distribution in the X direction when the desired dose amount distribution within the surface of the substrate 2 is sliced into a plurality of parts in a size corresponding to the locus 4a of the ion beam 4 within the surface of the substrate is determined for each position y of the substrate 2 in the Y direction, and the scanning speed distribution of the ion beam 4 is changed according to the position y of the substrate 2 in the Y direction so that the determined dose amount is realized in the corresponding position y.

Since the scanning speed vx of the ion beam 4 is proportional to the time rate of change dP(t)/dt of the above-described scanning output P(t), to change the scanning speed distribution of the ion beam 4 as described above, specifically, the waveform of the scanning output P(t) is adjusted.

Figure 19:
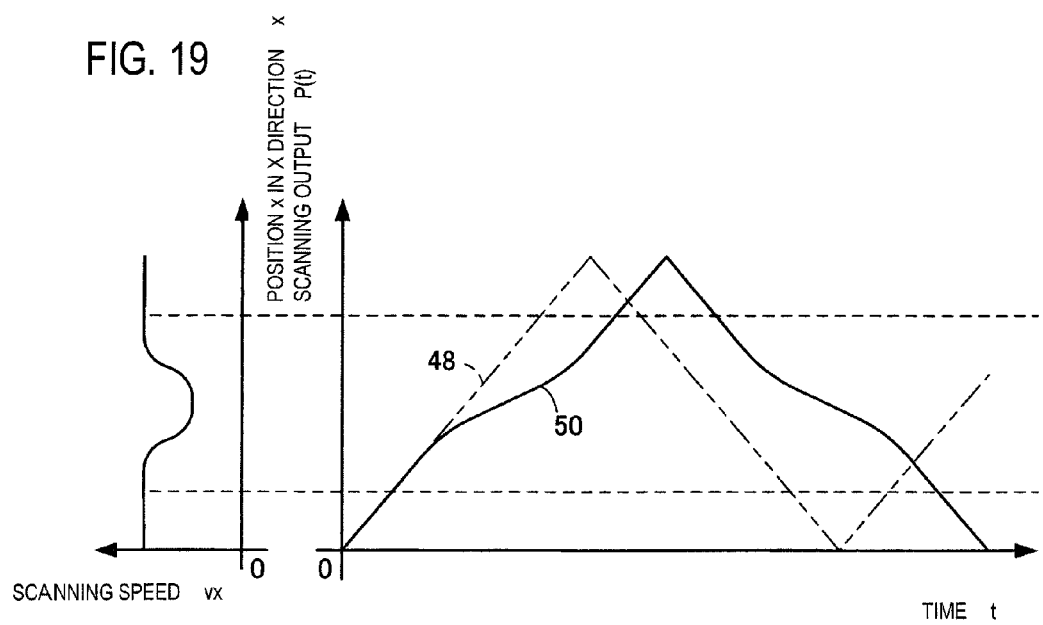
FIG. 19 is a view showing an example of the scanning output used in the scanning of the ion beam when the dose amount distribution shown in FIG. 3 is formed in accordance with one or more embodiments of the invention.

For example, to realize the concave scanning speed distribution as shown in FIGS. 4 to 8, for example as in an example shown in FIG. 19 (This is exaggeratingly shown in order that the waveform is easy to understand. The same applies to FIG. 20 described later.), the waveform 50 of the scanning output P(t) is shaped into an S shape in a position corresponding to the concave portion of the scanning speed distribution of the ion beam 4, and the inclination thereof (that is, dP(t)/dt) is gradually changed. That is, the inclination is gradually decreased and then, is returned to the original one. This can be realized by shaping the original triangular waveform 48 as described above. This waveform shaping of the scanning output P(t) can be performed, for example, by the control by the controller 36 by using the measurement information from the above-described multipoint faradays 38 and 39.

Contrary to the above-described example, to make the scanning speed distribution of the ion beam 4 convex as described later, the inclination of the S-shaped part of the waveform 50 is made opposite to that in the example shown in FIG. 19. That is, the inclination is gradually increased and then, is returned to the original one.

When the scanning output P(t) is the triangular waveform 48, since the inclination thereof is constant, the scanning speed vx is constant, so that the scanning speed distribution is flat.

Since the scanning speed vx of the ion beam 4 is much higher than the driving speed vy of the substrate 2, it is appropriate to consider that the beam current density of the ion beam 4 during one one-way scanning or one reciprocative scanning of the ion beam 4 within the surface of the substrate 2 is constant. Moreover, for the same reason, since the movement distance of the substrate 2 in the Y direction during one one-way scanning or one reciprocative scanning of the ion beam 4 within the surface of the substrate 2 is extremely small, it is not particularly necessary to consider its influence on the formation of the desired dose amount distribution.

For example, expressing in frequency the difference in magnitude between the scanning speed vx of the ion beam 4 and the driving speed vy of the substrate 2, to cite a case where the diameter of the substrate 2 is 300 mm as an example, the driving cycle of the substrate 2 in the Y direction is approximately once every two seconds at most (in frequency, approximately 0.5 Hz at most), whereas the scanning frequency of the ion beam 4 in the X direction is 173 Hz which is much (hundred of times) higher. Since the scanning distance of the ion beam 4 and the driving distance of the substrate 2 are substantially similar to each other, the frequency difference is substantially the speed difference.

Since the scanning speed vx of the ion beam 4 is much higher than the driving speed vy of the substrate as mentioned above, instead of the scanning speed distribution for each one-way scanning, the scanning speed distribution for each reciprocative scanning of the ion beam 4 within the surface of the substrate 2 may be changed according to the position y of the substrate 2 in the Y direction. Even if this is done, briefly speaking, only the fineness of the change in the dose amount within the surface of the substrate 2 is made slightly rougher.

The desired dose amount distribution may be realized by driving the substrate 2 in the Y direction to make more than one reciprocation (including a case of one reciprocation and one one-way driving). In that case, the operation described with reference to FIGS. 4 to 10 is repeated a necessary number of times. In this case, the same scanning speed distribution of the ion beam 4 is used in the same position y of the substrate 2.

The shape of the circular implantation region 44, its position within the surface of the substrate 2, its dose amount distribution, and the dose amount distribution of the peripheral implantation region 46 mentioned above are merely an example and the present invention not limited thereto; what matters is that they are set to desired ones. For example, they are set to desired ones according to a viewpoint such that the correction of the semiconductor device property in a specific region in a semiconductor device formed within the surface of the substrate 2 is performed by ion implantation as described above.

For example, the dose amount distribution of the circular implantation region 44 may be a dose amount distribution gradually recessed like a bowl by providing a convex form opposite to the example shown in FIGS. 4 to 8 to the scanning speed distribution of the ion beam 4 when the circular implantation region 44 is formed and changing the width and height of the convex portion according to the position y of the substrate 2 in the Y direction.

While the dose amount distribution of the circular implantation region 44 has the form of a plurality of concentric circles in the example shown in FIGS. 3 to 10, it may have the form of a plurality of eccentric circles. It may have a form where the dose amount changes smoothly.

Moreover, the circular implantation region 44 is not necessarily a perfect circle; it may be a circle deviating from a perfect circle, for example an ellipse. In a broad sense including all these, it is called a circular implantation region in this description.

Figure 11:
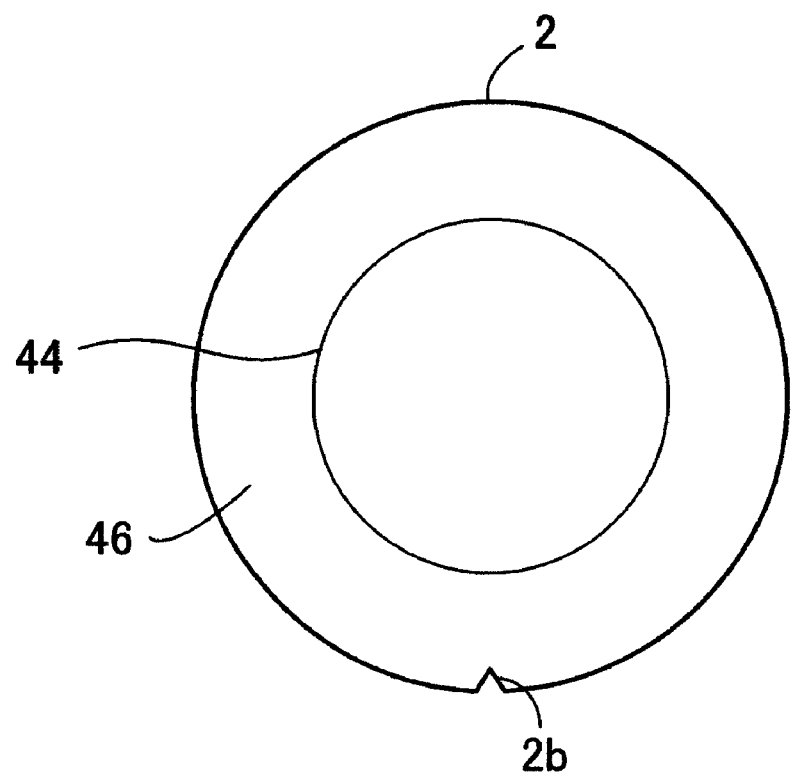
FIG. 11 is a schematic view showing another example of the dose amount distribution formed within the surface of the substrate in accordance with one or more embodiments of the invention.
Figure 12:
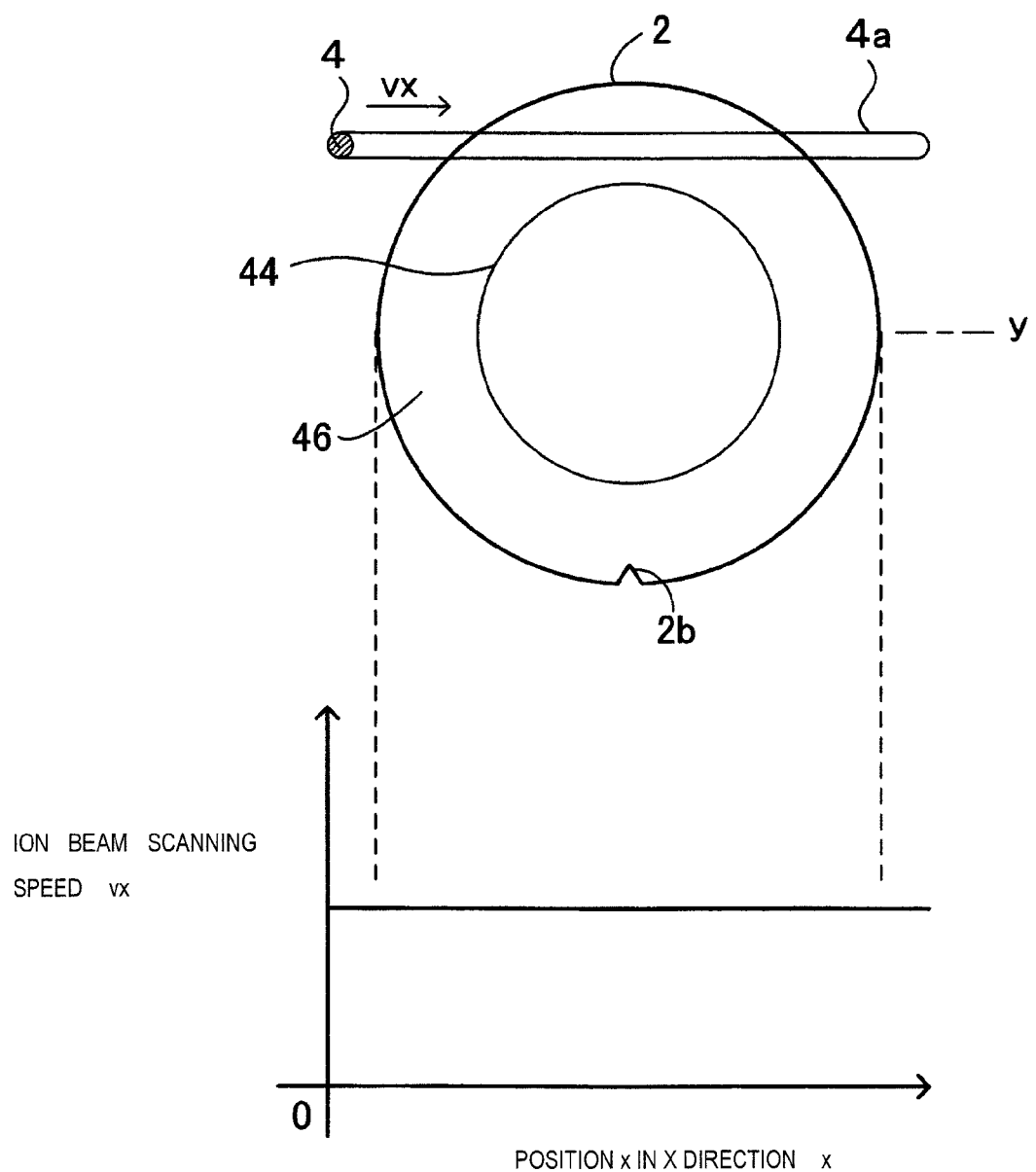
FIG. 12 is a view showing an example of the scanning speed distribution of one-way scanning of the ion beam when the dose amount distribution shown in FIG. 11 is formed in accordance with one or more embodiments of the invention, and is followed by FIG. 13.
Figure 13:
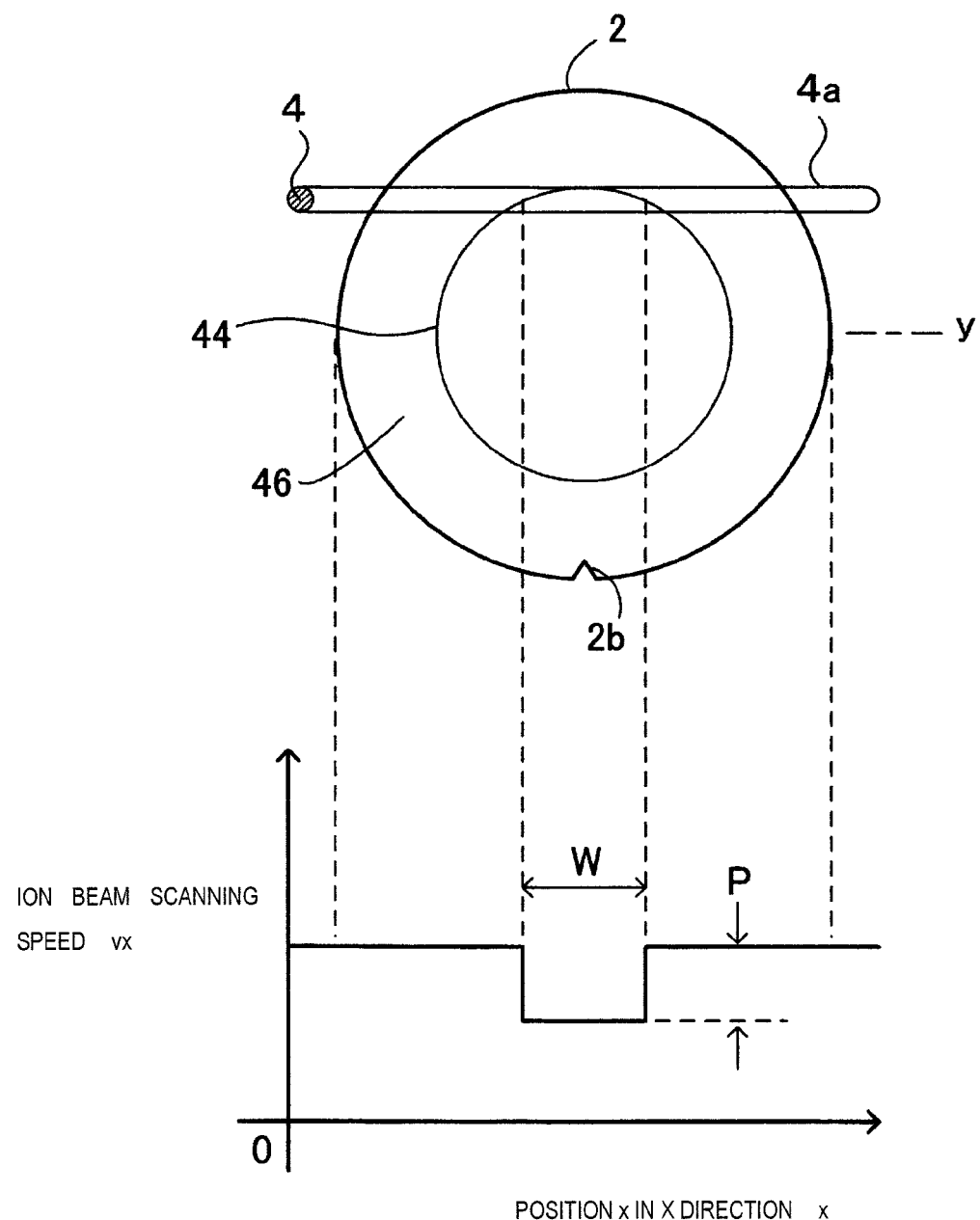
FIG. 13 is a view showing an example of the scanning speed distribution of one-way scanning of the ion beam when the dose amount distribution shown in FIG. 11 is formed in accordance with one or more embodiments of the invention, and is followed by FIG. 14.
Figure 14:
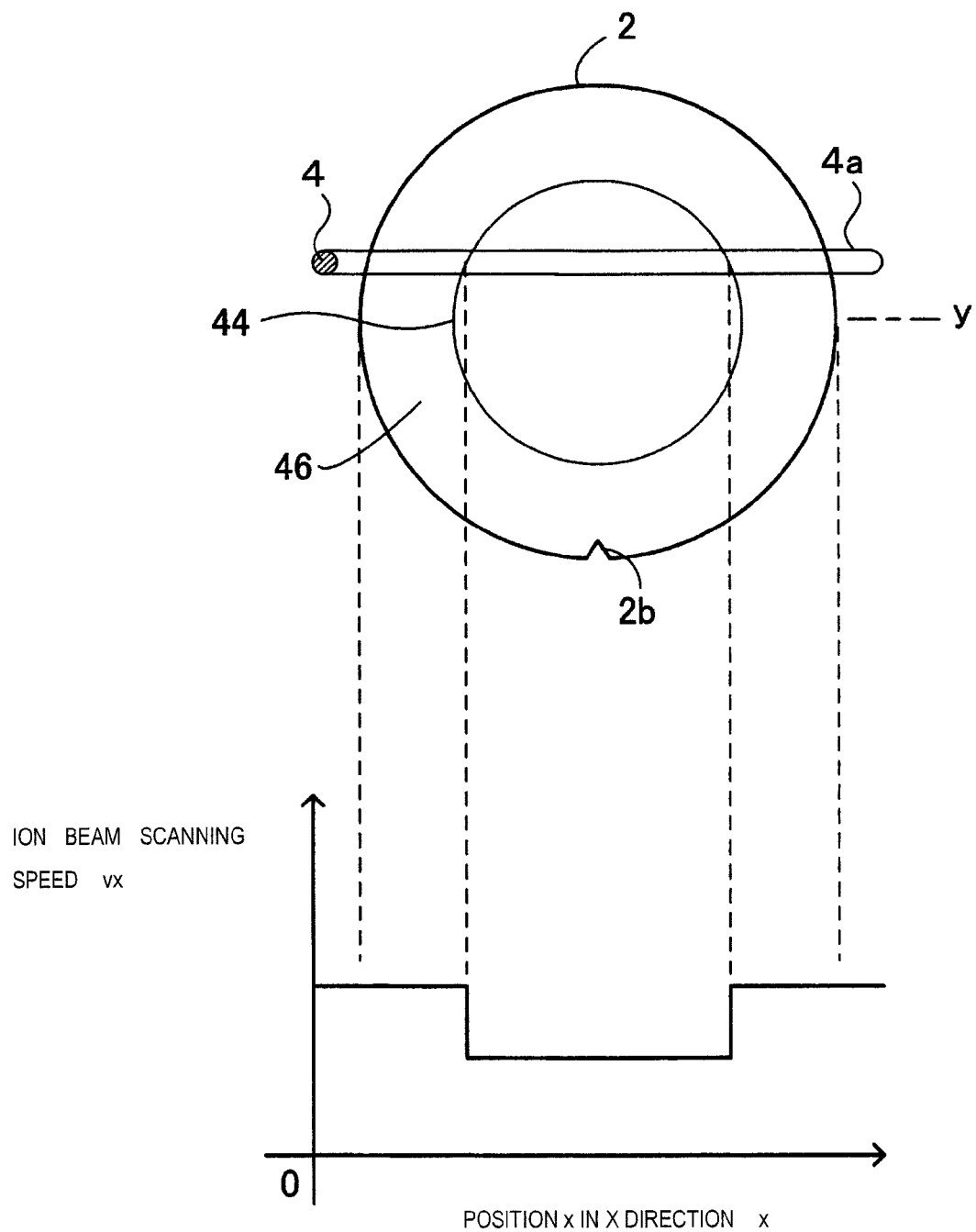
FIG. 14 is a view showing an example of the scanning speed distribution of one-way scanning of the ion beam when the dose amount distribution shown in FIG. 11 is formed in accordance with one or more embodiments of the invention, and is followed by FIG. 15.
Figure 15:
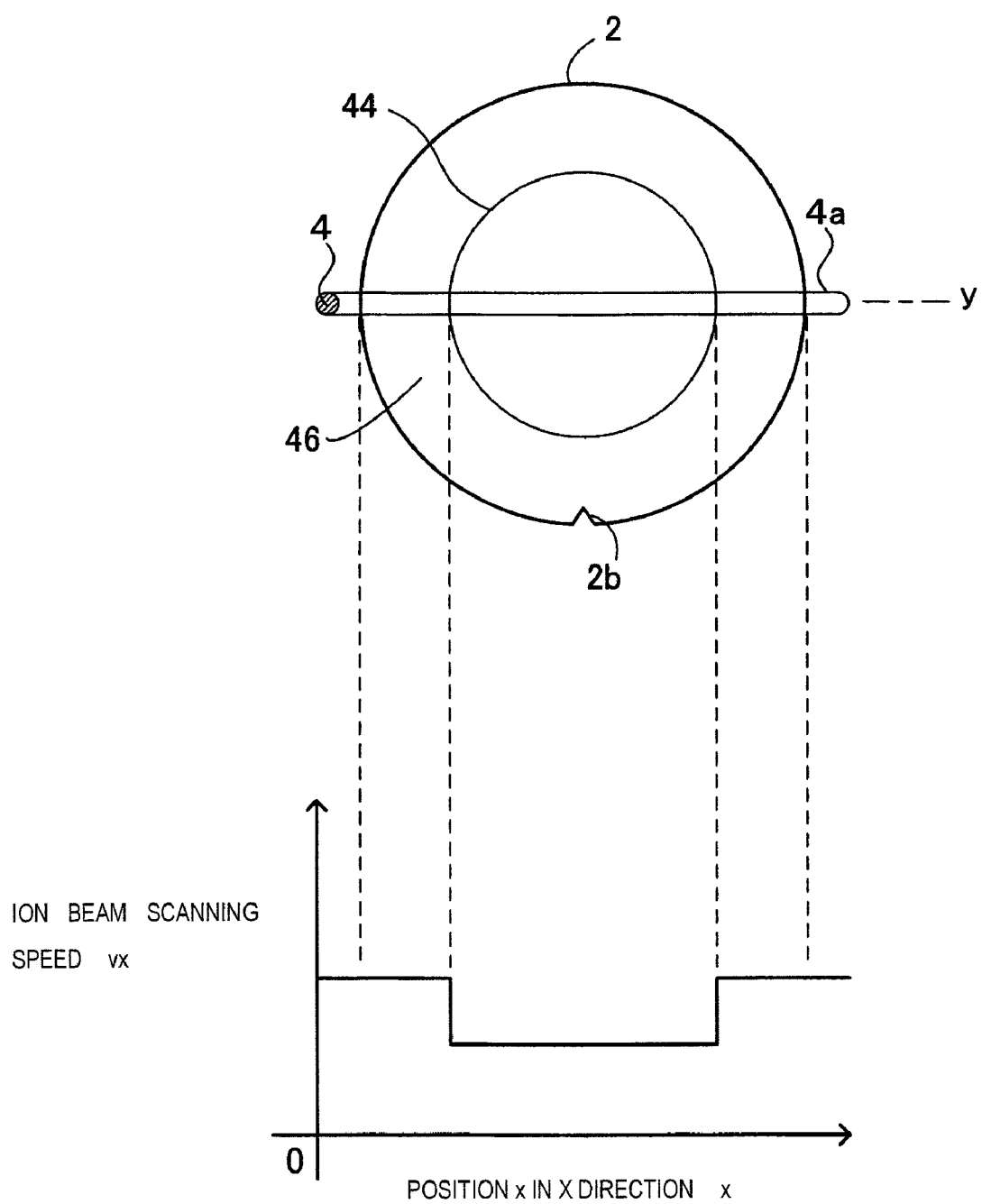
FIG. 15 is a view showing an example of the scanning speed distribution of one-way scanning of the ion beam when the dose amount distribution shown in FIG. 11 is formed in accordance with one or more embodiments of the invention, and is followed by FIG. 16.
Figure 16:
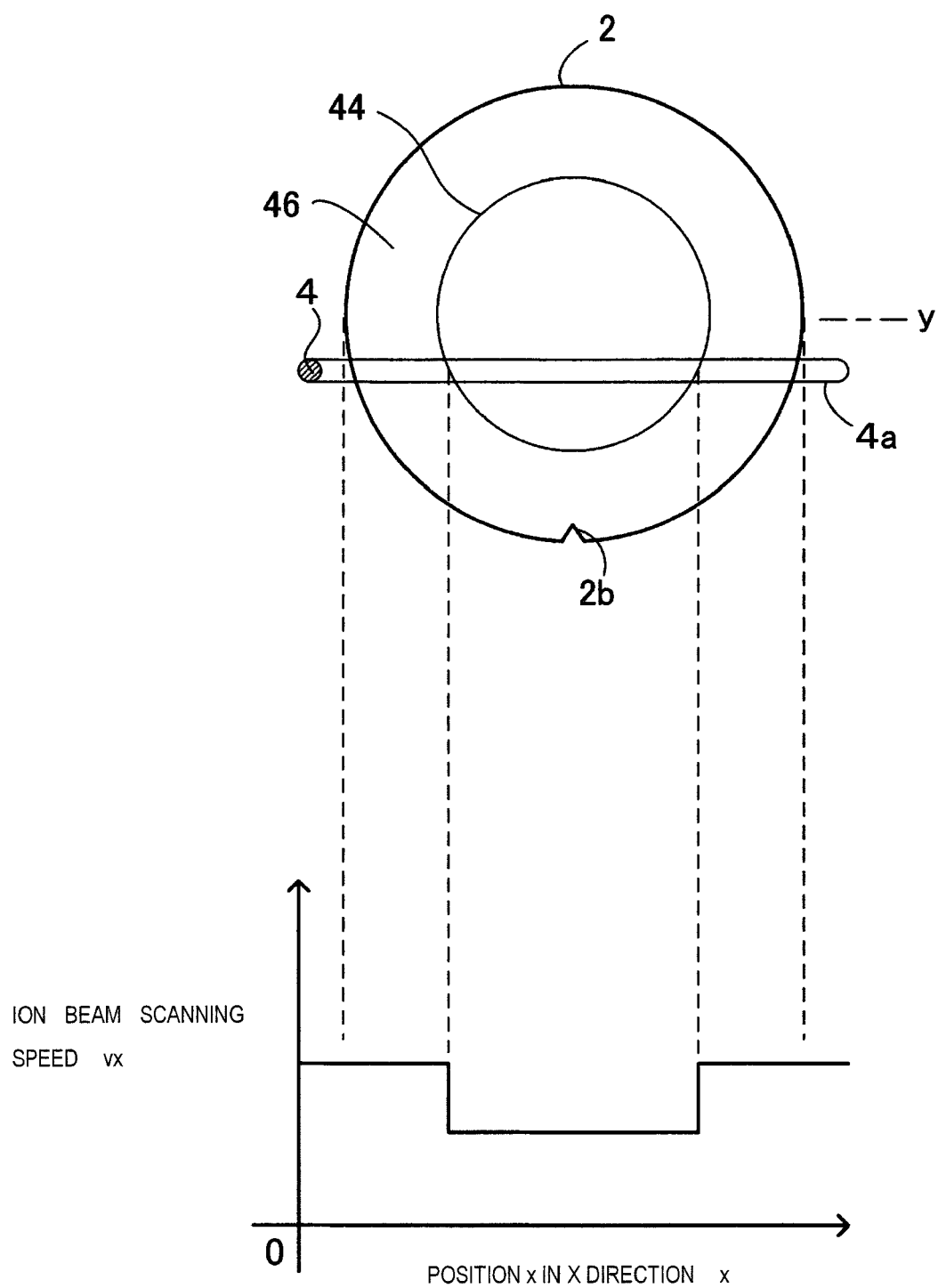
FIG. 16 is a view showing an example of the scanning speed distribution of one-way scanning of the ion beam when the dose amount distribution shown in FIG. 11 is formed in accordance with one or more embodiments of the invention, and is followed by FIG. 17.
Figure 17:
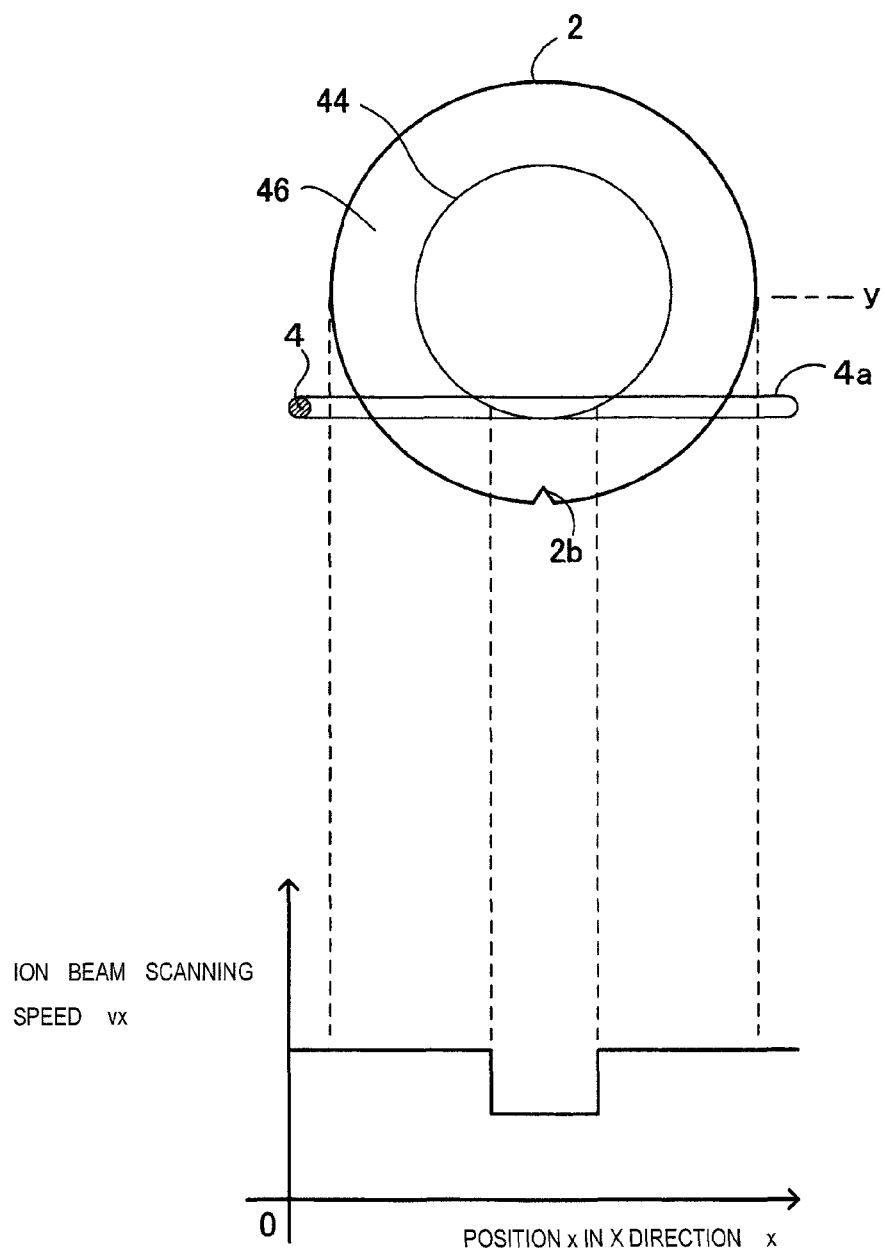
FIG. 17 is a view showing an example of the scanning speed distribution of one-way scanning of the ion beam when the dose amount distribution shown in FIG. 11 is formed in accordance with one or more embodiments of the invention, and is followed by FIG. 18.
Figure 18:
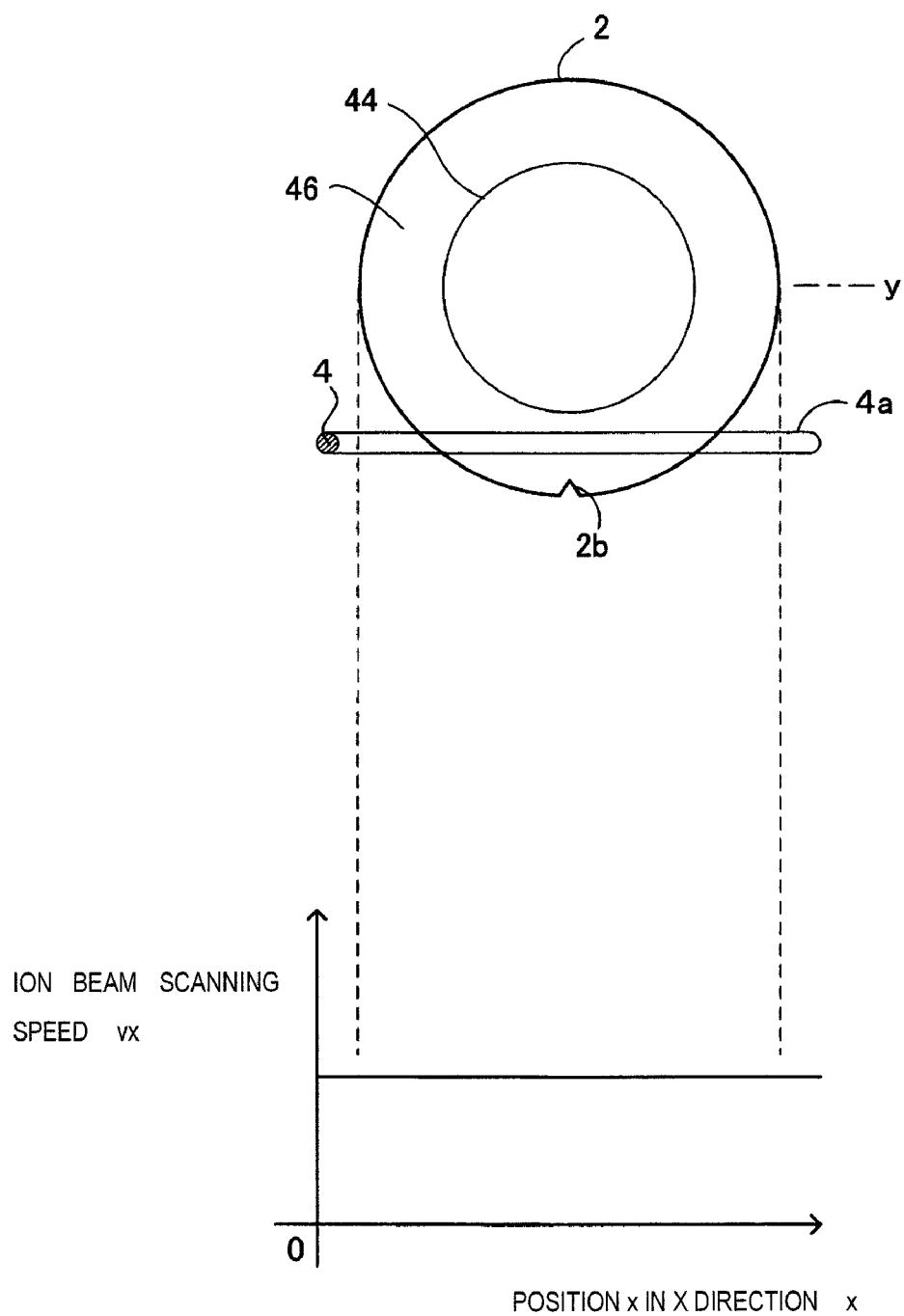
FIG. 18 is a view showing an example of the scanning speed distribution of one-way scanning of the ion beam when the dose amount distribution shown in FIG. 11 is formed in accordance with one or more embodiments of the invention.

FIG. 11 shows another example of the dose amount distribution formed within the surface of the substrate 2 in accordance with one or more embodiments of the invention. Parts the same as or corresponding to those of the above-described example are denoted by the same reference numerals, and differences from the above-described example will mainly be described below. The circular implantation region 44 has, in this example, a dose amount distribution uniformly swelling like a cylinder.

An example of the distribution of the scanning speed vx (that is, the scanning speed distribution) of one one-way scanning of the ion beam 4 when the dose amount distribution shown in FIG. 11 is formed is shown in FIGS. 12 to 18. In this case, the circular implantation region 44 and the peripheral implantation region 46 are also formed within the surface of the substrate 2 by successively changing the scanning speed distribution of the ion beam 4 within the surface of the substrate 2 according to the position y of the substrate in the Y direction.

More specifically, as in the example shown in FIGS. 13 to 17, the scanning speed distribution of the ion beam 4 when the circular implantation region 44 is formed is made concave, and the width W of the concave portion is changed according to the position y of the substrate 2 in the Y direction while the depth P thereof is maintained constant. By this, the above-described circular implantation region 44 can be formed.

Figure 20:
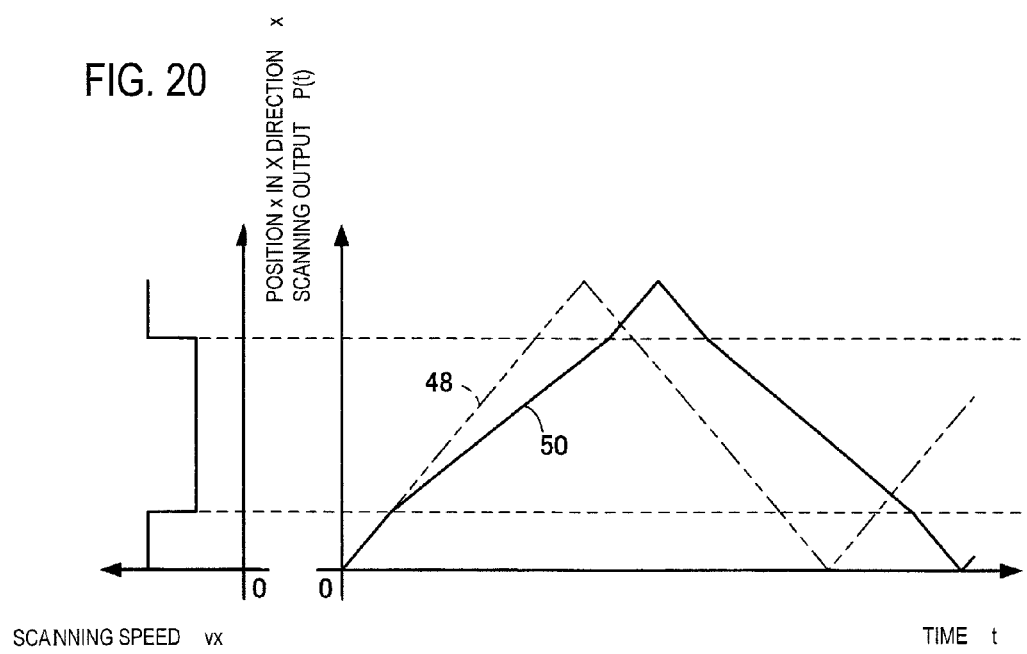
FIG. 20 is a view showing an example of the scanning output used in the scanning of the ion beam when the dose amount distribution shown in FIG. 11 is formed in accordance with one or more embodiments of the invention.
Figure 22:
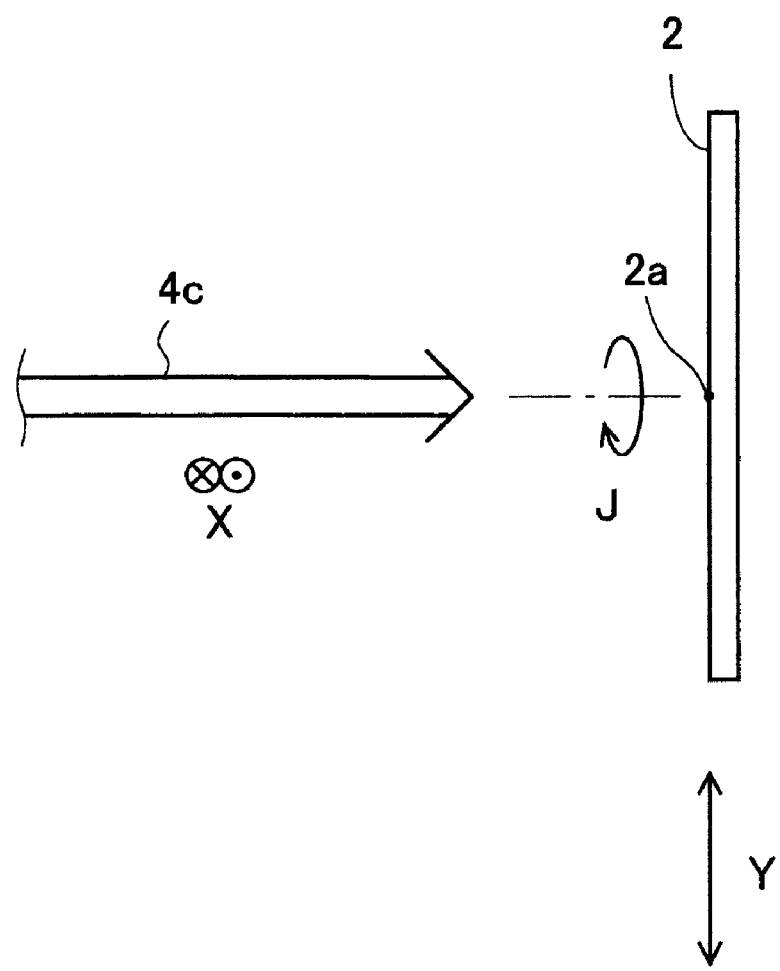
FIG. 22 is a schematic view showing an example of the conventional ion implantation method.
Figure 24:
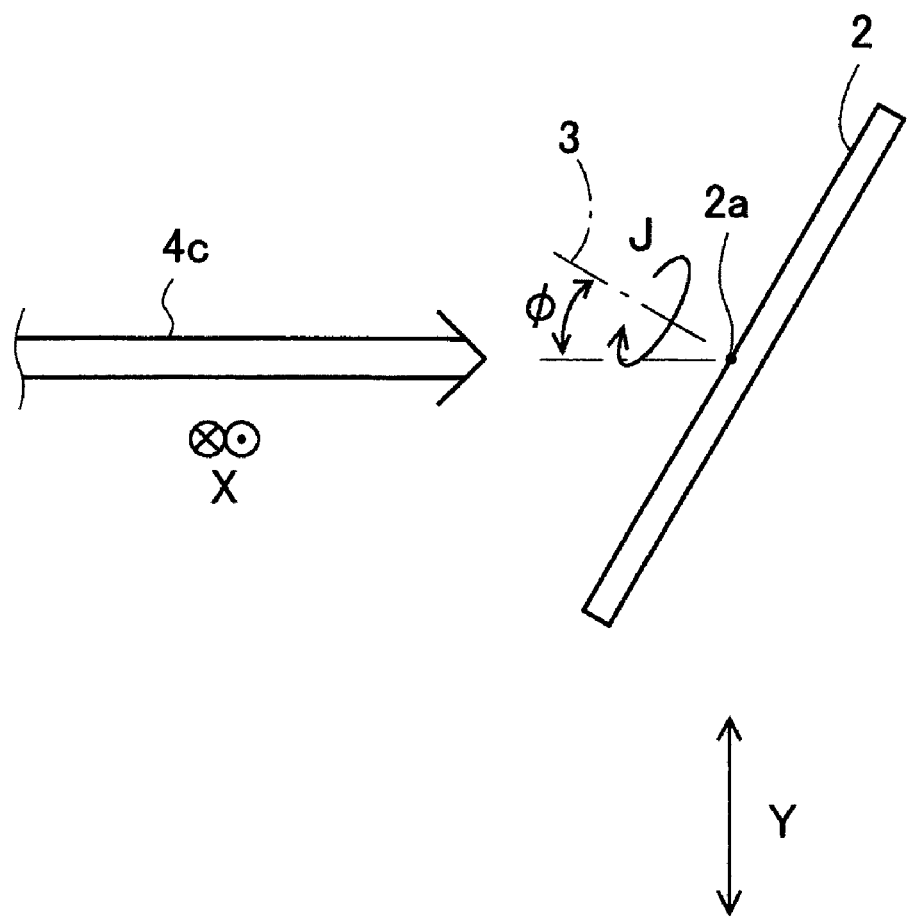
FIG. 24 is a schematic view showing an example of a case when the ion implantation is performed using the conventional ion implantation method while a tile angle is larger than zero degree.

To realize the concave scanning speed distribution as shown in FIGS. 13 to 17, for example as in the example shown in FIG. 20, the inclination of the waveform 50 of the scanning output P(t) is changed in a position corresponding to the concave portion of the scanning speed distribution of the ion beam 4. Specifically, the inclination is decreased with a constant inclination. This can be realized by shaping the original triangular waveform 48 as described above.

Contrary to the above-described example, the dose amount distribution of the circular implantation region 44 may be made a uniformly recessed dose amount distribution by making convex the scanning speed distribution of the ion beam 4 when the circular implantation region 44 is formed and changing the width of the convex portion according to the position y of the substrate 2 in the Y direction while the height thereof is maintained constant. In this case, contrary to the example shown in FIG. 20, the inclination of the waveform of the scanning output P(t) is increased with a constant inclination in a position corresponding to the convex portion of the scanning speed distribution of the ion beam 4.

The controller 36 controls the beam scanner based on the position information PD of the substrate 2 from the substrate position detector 33, specifically, in this embodiment, controls the scanning power source 22 to thereby change the scanning speed distribution, in the X direction, of the ion beam 4 within the surface of the substrate 2 for each one-way scanning or each reciprocative scanning according to the position y of the substrate 2 in the Y direction. By this, control to form the circular implantation region 44 and the peripheral implantation region 46 as shown in the above-described examples within the surface of the substrate 2 can be performed. Specifically, control to shape the waveform of the scanning output P(t) outputted from the scanning power source 22 as described above can be performed.

As described above, according to the ion implantation method or the ion implantation apparatus according to one or more embodiments of the invention, the circular implantation region 44 and the peripheral implantation region 46 the dose amounts of which are different from each other can be formed within the surface of the substrate 2 without the use of the step rotation of the substrate 2.

Consequently, the ion implantation method or the ion implantation apparatus according to one or more embodiments of the invention is also applicable to an implantation process where step rotation implantation must not be performed. For example, the correction of the semiconductor device property in a specific region in a semiconductor device formed within the surface of the substrate 2 can be performed without the use of the step rotation of the substrate 2.

Moreover, since the circular implantation region 44 and the peripheral implantation region 46 the dose amounts of which are different from each other can be formed within the surface of the substrate 2 without the use of the step rotation of the substrate 2, unlike in the case where the step rotation of the substrate 2 is used, a dose amount distribution other than a rotationally symmetric distribution can be formed. Moreover, since the center of the circular implantation region 44 can be shifted from the central portion 2a of the substrate 2, a dose amount distribution with a high degree of freedom can be formed. Further, the uniformity of the dose amount distribution of the peripheral implantation region 46 can be improved by uniformizing the dose amount distribution.

Moreover, the circular implantation region 44 and the peripheral implantation region 46 can be formed under a condition where the tilt angle is made larger than zero degrees by the tilt angle changer 34. Further, even in that case, unlike in the case where the step rotation of the substrate 2 is used, since the direction of the ion beam 4 incident on the substrate 2 is invariant, a trouble such that the implantation property is changed by a change of the incident direction of the ion beam 4 can be prevented from occurring.

This will be described by using FIG. 21 showing an example of a case where in the manufacturing process of forming a multiplicity of field-effect transistors on the substrate 2, ion implantation is performed by irradiating the extension 58 thereof with the ion beam 4 as in the example shown in FIG. 25. Parts the same as or corresponding to those of FIG. 25 are denoted by the same reference numerals, and only differences therefrom will be described.

According to the ion implantation method or the ion implantation apparatus according to one or more embodiments of the invention, since the step rotation of the substrate 2 is not used, even if the tilt angle $\phi$ is larger than zero degrees, further, however large it is made, the direction of the ion beam 4 incident on the extension 58 is invariant as shown in A of FIG. 21. Consequently, a trouble such that the implantation property is changed as described above by a change of the direction of incidence of the ion beam 4 onto the extension 58 can be prevented from occurring.

Consequently, the ion implantation method or the ion implantation apparatus according to one or more embodiments of the invention produces more remarkable effects when the circular implantation region 44 and the peripheral implantation region 46 as described above are formed within the surface of the substrate 2 to perform the correction of the semiconductor device property and the like and this is performed with a tilt angle $\phi$ larger than zero degrees.

As in the embodiment shown in FIG. 2, when the direction in which the substrate 2 is driven is the Y direction substantially orthogonal to the scanning direction X of the ion beam 4, if the tilt angle $\phi$ is larger than zero degrees, the distance $L_R$ of a relative movement, accompanying it, of the substrate 2 with respect to the ion beam 4 within the substrate surface is larger than a movement distance $L_Y$ of the substrate 2 in the Y direction because of the relationship of an expression shown below. Therefore, in consideration of this relationship, the position information PD representing the position y of the substrate 2 in the Y direction is handled. Thereby, the influence of the magnitude of the tilt angle $\phi$ is not received. When the driving direction of the substrate 2 is set to a direction substantially parallel to the surface of the substrate 2 as described above, such consideration is unnecessary since the influence of the tilt angle $\phi$ is not received.

$$L_R = L_Y / \cos \phi \qquad \text{[Expression 1]}$$

It should be considered that the embodiments disclosed this time are illustrative in all aspects and is not limitative. The scope of the present invention is indicated not by the meaning described above but by the claims, and all changes that fall within the meaning equivalent to the claims and the scope are to be embraced.

The present application is based on a Japanese patent application (Patent Application No. 2008-290190) filed on Nov. 12, 2008, and the contents thereof are hereby incorporated by reference.

Explanation of Reference Numerals
 2 Substrate
 4 Ion beam
 20 Scanner
 22 Scanning power source
 32 Substrate driver
 33 Substrate position detector
 34 Tilt angle changer
 36 Controller
 44 Circular implantation region
 46 Peripheral implantation region

The invention claimed is:

1. An ion implantation method for performing ion implantation into a substrate, the ion implantation method comprising:
  reciprocatively scanning an ion beam in a first direction;
  mechanically driving the substrate in a second direction intersecting the first direction while making a driving speed of the substrate directly proportional to a beam current density of the ion beam in a region where the ion beam is incident on the substrate;
  wherein a peripheral implantation region surrounds a circular implantation region, and
  wherein a dose amount of the peripheral implantation region is different from that of the circular implantation region,
  wherein the dose amount of the peripheral implantation region is formed within a surface of the substrate by:
    making variable a scanning speed of the ion beam within the surface of the substrate, and
    changing a scanning speed distribution, in the first direction, of the ion beam within the surface of the substrate for each one-way scanning or each reciprocative scanning, according to a position of the substrate in the second direction, without a rotation of the substrate, and
    wherein the scanning speed distribution includes a scanning speed distribution in which the scanning speed of the ion beam changes partially.

2. The ion implantation method according to claim 1, wherein a dose amount distribution of the circular implantation region is made a gradually swelling dose amount distribution by making concave the scanning speed distribution of the ion beam when the circular implantation region is formed and changing a width and a depth of the concave portion according to the position of the substrate in the second direction.

3. The ion implantation method according to claim 1, wherein a dose amount distribution of the circular implantation region is made a gradually recessed dose amount distribution by making convex the scanning speed distribution of the ion beam when the circular implantation region is formed and changing a width and a height of the convex portion according to the position of the substrate in the second direction.

4. The ion implantation method according to claim 1, wherein a dose amount distribution of the circular implantation region is made a uniformly swelling dose amount distribution by making concave the scanning speed distribution of the ion beam when the circular implantation region is formed and changing a width of the concave portion according to the position of the substrate in the second direction while maintaining a depth of the concave portion constant.

5. The ion implantation method according to claim 1, wherein a dose amount distribution of the circular implantation region is made a uniformly recessed dose amount distribution by making convex the scanning speed distribution of the ion beam when the circular implantation region is formed and changing a width of the convex portion according to the position of the substrate in the second direction while maintaining a height of the convex portion constant.

6. The ion implantation method according to claim 1, wherein ion implantation is performed while a tilt angle which is an angle formed between a normal to the surface of the substrate and the ion beam is larger than zero degrees.

7. The ion implantation method according to claim 6, wherein the second direction is substantially orthogonal to the first direction, and when the tilt angle is $\phi$ and a distance of a relative movement of the substrate with respect to the ion beam within a surface parallel to a surface of the substrate is $L_R$, a movement distance $L_Y$ of the substrate in the second direction satisfies the following expression or equivalent expression thereof: $L_Y = L_R \cos\phi$.

8. An ion implantation apparatus that performs ion implantation into a substrate both by reciprocatively scanning an ion beam in a first direction and by mechanically driving the substrate in a second direction intersecting the first direction while making a driving speed of the substrate directly proportional to a beam current density of the ion beam in a region where the ion beam is incident on the substrate, the ion implantation apparatus comprising:
a beam scanner that reciprocatively scans the ion beam in the first direction by an electric field or a magnetic field, a scanning speed of the ion beam within a surface of the substrate being variable;
a substrate driver that mechanically drives the substrate in the second direction;
a substrate position detector that detects a position of the substrate in the second direction and outputs position information representing the position; and
a controller that performs control to form a circular implantation region and a peripheral implantation region which surrounds the circular implantation region and a dose amount of which is different from that of the circular implantation region within a surface of the substrate by controlling the beam scanner based on the position information from the substrate position detector to thereby change a scanning speed distribution, in the first direction, of the ion beam within the surface of the substrate for each one-way scanning or each reciprocative scanning, according to the position of the substrate in the second direction, without a rotation of the substrate, and the scanning speed distribution includes a scanning speed distribution in which the scanning speed of the ion beam changes partially.

9. The ion implantation apparatus according to claim 8, wherein the controller performs control to make a dose amount distribution of the circular implantation region a gradually swelling dose amount distribution by making concave the scanning speed distribution of the ion beam when the circular implantation region is formed and changing a width and a depth of the concave portion according to the position of the substrate in the second direction.

10. The ion implantation apparatus according to claim 8, wherein the controller performs control to make a dose amount distribution of the circular implantation region a gradually recessed dose amount distribution by making convex the scanning speed distribution of the ion beam when the circular implantation region is formed and changing a width and a height of the convex portion according to the position of the substrate in the second direction.

11. The ion implantation apparatus according to claim 8, wherein the controller performs control to make a dose amount distribution of the circular implantation region a uniformly swelling dose amount distribution by making concave the scanning speed distribution of the ion beam when the circular implantation region is formed and changing a width of the concave portion according to the position of the substrate in the second direction while maintaining a depth of the concave portion constant.

12. The ion implantation apparatus according to claim 8, wherein the controller performs control to make a dose amount distribution of the circular implantation region a uniformly recessed dose amount distribution by making convex the scanning speed distribution of the ion beam when the circular implantation region is formed and changing a width of the convex portion according to the position of the substrate in the second direction while maintaining a height of the convex portion constant.

13. The ion implantation apparatus according to claim 8, comprising a tilt angle changer that changes an inclination of the substrate to thereby change a tilt angle which is an angle formed between a normal to the surface of the substrate and the ion beam.

14. The ion implantation apparatus according to claim 13, wherein the second direction is substantially orthogonal to the first direction, and when the tilt angle is $\phi$ and a distance of a relative movement of the substrate with respect to the ion beam within a surface parallel to a surface of the substrate is $L_R$, the controller further includes a function of performing a control so that a movement distance $L_Y$ of the substrate in the second direction satisfies the following expression or equivalent expression thereof: $L_Y = L_R \cdot \cos\phi$.

* * * * *